(12) United States Patent
Irinoda

(10) Patent No.: US 8,416,821 B2
(45) Date of Patent: Apr. 9, 2013

(54) SURFACE EMITTING LASER ELEMENT, SURFACE EMITTING LASER ARRAY, OPTICAL SCANNING UNIT, IMAGE FORMING APPARATUS AND METHOD OF MANUFACTURING SURFACE EMITTING LASER ELEMENT

(75) Inventor: Mitsugu Irinoda, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 69 days.

(21) Appl. No.: 13/107,094

(22) Filed: May 13, 2011

(65) Prior Publication Data

US 2011/0304682 A1    Dec. 15, 2011

(30) Foreign Application Priority Data

Jun. 11, 2010 (JP) ................................. 2010-133466
Apr. 7, 2011 (JP) ................................. 2011-084985

(51) Int. Cl.
*H01S 5/00* (2006.01)

(52) U.S. Cl. ............... 372/44.01; 372/43.01; 372/50.11; 372/50.124

(58) Field of Classification Search ............... 372/43.01, 372/44.01, 50.11
See application file for complete search history.

(56) References Cited

U.S. PATENT DOCUMENTS

| | | | |
|---|---|---|---|
| 4,787,691 A * | 11/1988 | Lorenzo et al. | 385/3 |
| 6,529,541 B1 | 3/2003 | Ueki et al. | |
| 6,661,823 B1 | 12/2003 | Otoma et al. | |
| 7,020,173 B2 | 3/2006 | Yamamoto et al. | |
| 2009/0097517 A1 | 4/2009 | Sakamoto et al. | |
| 2010/0232465 A1 * | 9/2010 | Tsukiji et al. | 372/45.01 |

FOREIGN PATENT DOCUMENTS

| | | |
|---|---|---|
| JP | 9-33949 | 2/1997 |
| JP | 2002-208755 | 7/2002 |
| JP | 2004-200211 | 7/2004 |
| JP | 2006-13366 | 1/2006 |
| JP | 2007-150170 | 6/2007 |
| JP | 2008-34637 | 2/2008 |
| JP | 2009-94332 | 4/2009 |
| JP | 2009-302113 | 12/2009 |

OTHER PUBLICATIONS

Nov. 8, 2011 European search report in connection with counterpart European patent application No. 11 16 8290.

* cited by examiner

*Primary Examiner* — Dung Nguyen
(74) *Attorney, Agent, or Firm* — Cooper & Dunham LLP

(57) ABSTRACT

A surface emitting laser element includes a light emission part having a mesa structure. The light emission part includes a lower reflector; a resonator structure including an active layer; and an upper reflector. The lower reflector, the resonator structure and the upper reflector are laminated on a substrate. A peripheral part of a top surface of the mesa structure is covered by a dielectric layer that has a tapered surface such that a thickness decreases in a direction toward an outermost part, a taper angle of the tapered surface with respect to a surface of the substrate is smaller than a slope angle of a side wall of the mesa structure with respect to the surface of the substrate, and an end part of the dielectric layer coincides with an end part of the upper reflector.

10 Claims, 18 Drawing Sheets

FIG.16

| $\theta$ (°) | 75 | 75 | 75 | 75 | 75 | 75 |
|---|---|---|---|---|---|---|
| $\delta$ (°) | 70 | 60 | 40 | 30 | 20 | 10 |
| DISCONNECTION | OCCURRED | NOT OCCURRED | NOT OCCURRED | NOT OCCURRED | NOT OCCURRED | OCCURRED |

FIG.17

| $\theta$ (°) | 50 | 65 | 75 | 80 |
|---|---|---|---|---|
| $\delta$ (°) | 60 | 60 | 60 | 60 |
| DISCONNECTION | OCCURRED | NOT OCCURRED | NOT OCCURRED | OCCURRED |

(RELATED ART 2)

SURFACE EMITTING LASER ELEMENT, SURFACE EMITTING LASER ARRAY, OPTICAL SCANNING UNIT, IMAGE FORMING APPARATUS AND METHOD OF MANUFACTURING SURFACE EMITTING LASER ELEMENT

BACKGROUND OF THE INVENTION

1. Field of the Invention

The present invention relates to a surface emitting laser element, a surface emitting laser array, an optical scanning unit, an image forming apparatus and a method of manufacturing a surface emitting laser element; and in more detail, to a surface emitting laser element and a surface emitting laser array in which laser light is emitted in a direction perpendicular to a surface of a substrate, an optical scanning unit having the surface emitting laser element or the surface emitting laser array, an image forming apparatus having the optical scanning unit, and a method of manufacturing a surface emitting laser element in which laser light is emitted in a direction perpendicular to a surface of a substrate.

2. Description of the Related Art

A vertical cavity surface emitting laser is such that light is emitted in a direction perpendicular to a surface of a substrate, and recently has drawn attention because of low cost, low power consumption, small size, being suitable for a two-dimensional device, and high performance, in comparison to an edge-emitting-type semiconductor laser such that light is emitted in a direction parallel to a surface of a substrate (see Japanese Laid-Open Patent Application No. 2002-208755 (Patent Document 1) and Japanese Laid-Open Patent Application No. 2004-200211 (Patent Document 2), for example).

A process of manufacturing a surface emitting laser element includes a process of wiring for electrically connecting a p-side electrode and an electrode pad. In this process, because the p-side electrode is formed on the top of a mesa, wiring across a large step is carried out, and thus, may cause a disconnection or a degradation in reliability of the wiring because of an insufficiency of a step coverage of a wiring member. The step coverage means a state of the wiring member covering the step.

Therefore, an improvement of the step coverage of the wiring member as a result of the mesa having a taper shape (see Japanese Laid-Open Patent Application No. 09-33949 (Patent Document 3), Japanese Laid-Open Patent Application No. 2006-013366 (Patent Document 4) and Japanese Laid-Open Patent Application No. 2007-150170 (Patent Document 5), for example), covering the entirety of a side wall of the mesa with the p-side electrode material (see Japanese Laid-Open Patent Application No. 2008-34637 (Patent Document 6), for example), increasing the wiring width on the side wall of the mesa (see Japanese Laid-Open Patent Application No. 2009-302113 (Patent Document 7)), and so forth, have been proposed. Further, Japanese Laid-Open Patent Application No. 2009-94332 (Patent Document 8) discloses a surface-emitting-type semiconductor laser device in which a taper is formed on a metal wiring that is formed on the top of the mesa, and further, the taper is covered by an interlayer dielectric film.

However, in a liquid crystal display device disclosed in Patent Document 3, the taper for the step is formed to have multiple stages, and an etching condition of wet etching or dry etching may be changed each time the taper angle for the step changes. Therefore, an in-plane distribution of the etching shape becomes a distribution of the shape of the step, thus uniformity of the shape of the step may not be satisfactory, and it may be difficult to manufacture the liquid crystal display device with a high yield.

Further, in a surface emitting semiconductor laser disclosed in Patent Document 4, the mesa has the taper shape and the wiring is formed. In this configuration, because an angle of a peripheral part of the top end of the mesa is close to a right angle, the wiring may be disconnected at this part, and thus, it may be difficult to manufacture the surface emitting semiconductor laser with a high yield.

Further, in a semiconductor laser disclosed in Patent Document 5, wiring is formed after the mesa is formed to be the taper shape through wet etching. In this configuration, because an angle of a peripheral part of the top end of the mesa is close to a right angle, the wiring may be disconnected at this part, and thus, it may be difficult to manufacture the surface emitting semiconductor laser with a high yield.

Further, Patent Document 6 discloses an example of a surface emitting semiconductor laser in which the entire surface of the side wall of the mesa is covered by metal wiring. In this configuration, variation in laser characteristics may be caused by stress in the metal wiring, which may result in a reduction of yield.

Further, in a surface emitting laser disclosed in Patent Document 7, the mesa has the taper shape and wiring is formed. In this configuration, because an angle of a peripheral part of the top end of the mesa is close to a right angle, the wiring may be disconnected at this part, and thus, it may be difficult to manufacture the surface emitting semiconductor laser with a high yield.

Further, in a surface emitting semiconductor laser disclosed in Patent Document 8, as shown in FIG. 15, at a top part of a mesa 5100, an end part of a contact metal 5101 having a taper shape is formed at a position away from the top end of the mesa 5100 by the distance "X". Further, an interlayer dielectric film 5102 is formed on an area ("X") at which a part of the top end of the mesa 5100 is exposed. Further, metal wiring 5103 is formed. In this surface emitting semiconductor laser, a part at which a thickness of the wiring material is very small (L4) may exist at an area indicated as "PART HAVING RISK OF DISCONNECTION". Therefore, it may be difficult to manufacture the surface emitting semiconductor laser with a high yield.

SUMMARY OF THE INVENTION

According to an embodiment of the present invention, a surface emitting laser element has a light emission part of a mesa structure. The light emission part includes a lower reflector, a resonator structure including an active layer and an upper reflector, laminated on a substrate. A peripheral part of a top surface of the mesa structure is covered by a dielectric layer having a tapered surface such that a thickness decreases in a direction toward an outermost part of the mesa structure. A taper angle of the tapered surface with respect to a surface of the substrate is smaller than a slope angle of a side wall of the mesa structure with respect to the surface of the substrate. Further, an end part of the dielectric layer coincides with the end part of the upper reflector.

Other objects, features and advantages of the embodiment will become more apparent from the following detailed description when read in conjunction with the accompanying drawings.

BRIEF DESCRIPTION OF THE DRAWINGS

FIG. 16 illustrates whether a disconnection occurred when the slope angle θ was fixed and a taper angle δ was varied;

FIG. 17 illustrates whether a disconnection occurred when the taper angle δ was fixed and the inclination angle θ was varied;

DETAILED DESCRIPTION OF THE EMBODIMENTS

An embodiment of the present invention has been devised in consideration of the above-mentioned situations, and a first object of the embodiment of the present invention is to provide a surface emitting laser element and a surface emitting laser array, which can be manufactured with a high yield.

A second object of the embodiment of the present invention is to provide an optical scanning unit which can stably carry out optical scanning with high precision.

A third object of the embodiment of the present invention is to provide an image forming apparatus which can stably form an image having high quality.

A fourth object of the embodiment of the present invention is to provide a method of manufacturing a surface emitting laser element, by which it is possible to manufacture the surface emitting laser element with a high yield.

Figure 1:
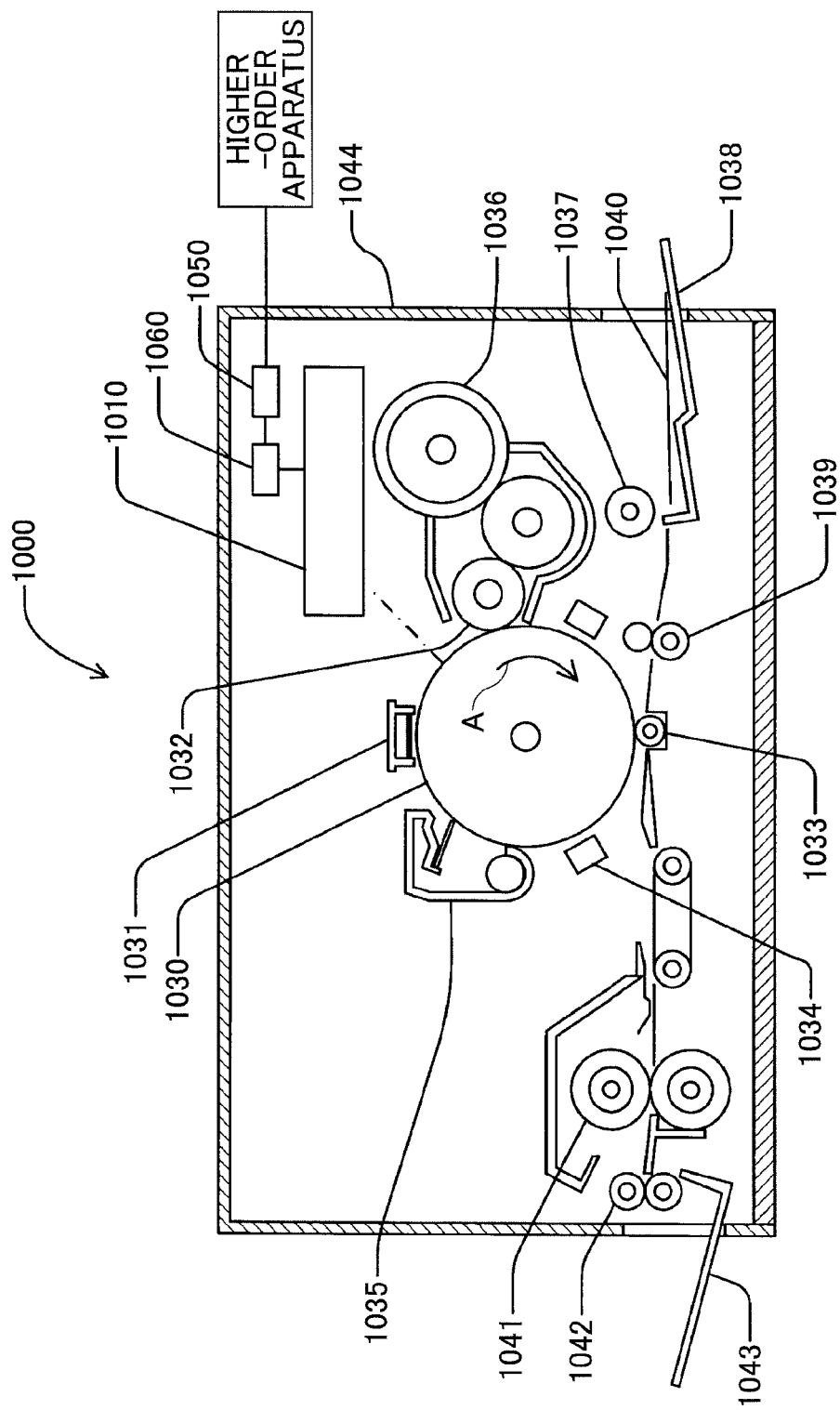
FIG. 1 illustrates a schematic side view of a laser printer according to an embodiment of the present invention.

Below, based on FIGS. 1 through 18, an embodiment of the present invention will be described. FIG. 1 shows a schematic configuration of a laser printer 1000 as an image forming apparatus according to the embodiment of the present invention.

The laser printer 1000 includes an optical scanning unit 1010, a photosensitive drum 1030 (i.e., an image carrying member), an electrification charger 1031, a development roller 1032, a transfer charger 1033, an electricity removal unit 1034, a cleaning unit 1035, a toner cartridge 1036, a paper feeding roller 1037, a paper feeding tray 1038, a registration roller pair 1039, fixing rollers 1041, paper ejection rollers 1042, a paper ejection tray 1043, a communication control unit 1050 and a printer control unit 1060 that controls the above-mentioned respective parts/components in a unifying manner. It is noted that these parts/components are provided at predetermined positions in the inside of an enclosure 1044 of the laser printer 1000.

The communication control unit 1050 controls bidirectional communication with a higher-order apparatus (for example, a personal computer) via a communication network or such.

The photosensitive drum 1030 is a cylindrical member, and a photosensitive layer is formed on a surface thereof. That is, the surface of the photosensitive drum 1030 acts as a to-be-scanned surface. The photosensitive drum 1030 is rotated in a direction indicated by an arrow A shown in FIG. 1.

The electrification charger 1031, the development roller 1032, the transfer charger 1033, the electricity removal unit 1034 and the cleaning unit 1035 are disposed near the surface of the photosensitive drum 1030, respectively. The electrification charger 1031→the development roller 1032→the transfer charger 1033→the electricity removal unit 1034→the cleaning unit 1035, are disposed in the stated order along the rotation direction A of the photosensitive drum 1030.

The electrification charger 1031 uniformly electrifies the surface of the photosensitive drum 1030.

The optical scanning unit 1010 scans the surface of the photosensitive drum 1030, which has been electrified by the electrification charger 1031, with a beam of light that has been modulated based on image information given by the high-order apparatus, and thus forms a latent image corresponding to the image information on the surface of the photosensitive drum 1030. The latent image thus formed moves in the direction of the development roller 1032 along with the rotation of the photosensitive drum 1030. A specific configuration of the optical scanning unit 1010 will be described later.

Toner is stored in the toner cartridge 1036, and the toner is supplied to the development roller 1032.

The development roller 1032 visualizes the image information by causing the toner supplied by the toner cartridge 1036 to adhere to the latent image formed on the surface of the photosensitive drum 1030. The latent image, to which the toner has adhered (referred to as a "toner image", hereinafter, for the sake of convenience), moves in the direction of the transfer charger 1033 along with the rotation of the photosensitive drum 1030.

Sheets of recording paper 1040 are stored in the paper feeding tray 1038. The paper feeding roller 1037 is disposed near the paper feeding tray 1038. The paper feeding roller 1037 takes the sheets of the recording paper 1040, sheet by sheet, from the paper feeding tray 1038, and conveys the sheet of the recording paper 1040 to the registration roller pair 1039. The registration roller pair 1039 holds the sheet of the recording paper 1040 taken by the paper feeding roller 1037 for a while, and feeds the sheet of the recording paper 1040 to a space between the photosensitive drum 1030 and the transfer charger 1033 in accordance with the rotation of the photosensitive drum 1030.

To the transfer charger 1033, a voltage having a reverse polarity to that of the toner is applied, in order that the transfer charger 1033 electrically attracts the toner existing on the surface of the photosensitive drum 1030 to the sheet of the recording paper 1040. By this voltage, the toner image on the surface of the photosensitive drum 1030 is transferred onto the sheet of the recording paper 1040. The sheet of the recording paper 1040 to which the toner image has been thus transferred is fed to the fixing rollers 1041.

In the fixing rollers 1041, heat and pressure are applied to the sheet of the recording paper 1040, and thereby the toner is fixed onto the sheet of the recording paper 1040. The sheet of the recording paper 1040 to which the toner has been thus fixed is fed to the ejection tray 1043 by means of the ejection rollers 1042, and is stacked on the ejection tray 1043 in sequence.

The electricity removal unit 1043 removes the electricity from the surface of the photosensitive drum 1043.

The cleaning unit 1035 removes the toner (residual toner) that is remaining on the surface of the photosensitive drum 1030. The part of the surface of the photosensitive drum 1030, from which part the residual toner has been thus removed, returns to a position facing the electrification charger 1031.

Next, the specific configuration of the optical scanning unit 1010 will be described.

Figure 2:
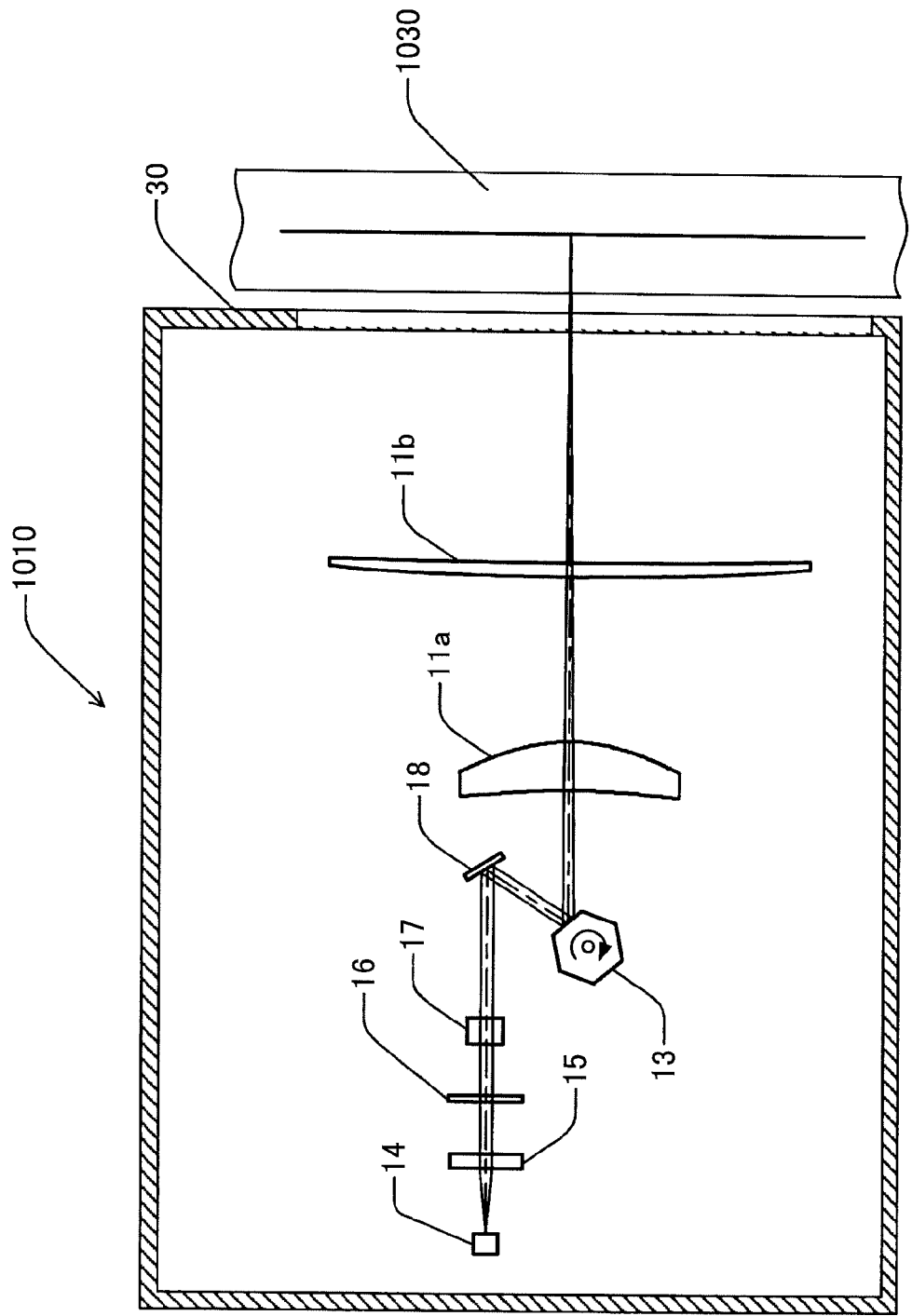
FIG. 2 shows a schematic internal plan view of an optical scanning unit shown in FIG. 1.

The optical scanning unit 1010 includes, as shown in FIG. 2 for example, a light source 14, a coupling lens 15, an aperture plate 16, a cylindrical lens 17, a reflection mirror 18, a polygon mirror 13 (i.e., a deflector), a deflector side scanning lens 11a (i.e., a part of a scanning optical system), an image surface side scanning lens 11b (i.e., another part of the scanning optical system) and a scanning control unit (not shown). These parts/components are assembled at predetermined positions in an optical housing 30.

It is noted that hereinafter, for the sake of convenience, a direction corresponding to a main scan direction will be simply referred to as a "main scan correspondence direction" and a direction corresponding to a sub-scan direction will be simply referred to as a "sub-scan correspondence direction".

The coupling lens 15 creates approximately parallel light from the beam of light emitted by the light source 14.

The aperture plate 16 has an aperture part, and defines a beam diameter of the beam of light having passed through the coupling lens 15.

The cylindrical lens 17 carries out image formation from the beam of light having passed through the aperture part of the aperture plate 16 with respect to the sub-scan correspondence direction near a deflection reflection surface of the polygon mirror 13 through the reflection mirror 18.

The optical system disposed on the light path between the light source 14 and the polygon mirror 13 is called a "pre-deflector optical system". In the present embodiment, the pre-deflector optical system includes the coupling lens 15, the aperture plate 16, the cylindrical lens 17 and the reflection mirror 18.

The polygon mirror 13 includes a member having a shape of a regular hexagonal prism having a low height, and the six deflection reflection surfaces are formed on its six side walls. This polygon mirror 13 is rotated at a constant speed around an axis that is parallel to the sub-scan correspondence direction, and deflects the beam of light reflected by the reflection mirror 18.

The deflector side scanning lens 11a is disposed on a light path of the beam of light having been deflected by the polygon mirror 13.

The image surface side scanning lens 11b is disposed on a light path of the beam of light having passed through the deflector side scanning lens 11a. Then, the surface of the photosensitive drum 1030 is irradiated with the beam of light having passed through the image surface side scanning lens 11b, and an optical spot is formed on the surface of the photosensitive drum 1030. The optical spot moves in a longitudinal direction of the photosensitive drum 1030 along with the rotation of the polygon mirror 13. That is, the photosensitive drum 1030 is scanned with the optical spot. The direction in which the optical spot moves at this time is the "main scan direction". Further, the direction in which the photosensitive drum 1030 rotates is the "sub-scan direction".

The optical system disposed on the light path between the polygon mirror 13 and the photosensitive drum 1030 is called a scan optical system. In the present embodiment, the scan optical system includes the deflector side scanning lens 11a and the image surface side scanning lens 11b. It is noted that at least one turning mirror may be disposed on at least one of the light path between the deflector side scanning lens 11a and the image surface side scanning lens 11b and the light path between the image surface side scanning lens 11b and the photosensitive drum 1030.

Figure 3:
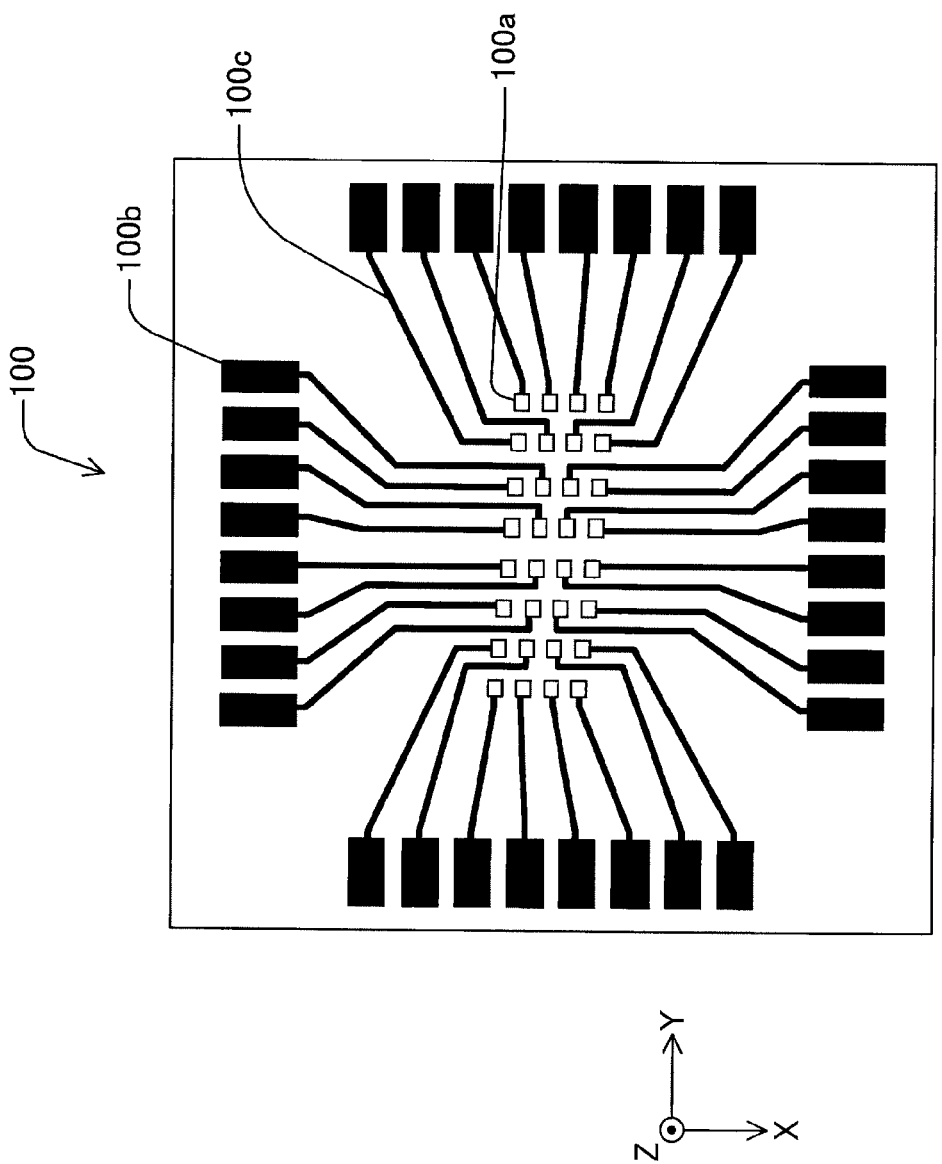
FIG. 3 illustrates a surface emitting laser array.

The light source 14 has a surface emitting laser array 100 as shown in FIG. 3 for example. It is noted that in the present specification, a direction of laser oscillation will be referred to as a Z-axis direction, and two mutually orthogonal directions on a plane perpendicular to the Z-axis direction will be referred to as a X-axis direction and a Y-axis direction, respectively.

The surface emitting laser array 100 has 32 light emission parts 100a disposed two-dimensionally, and 32 electrode pads 100b that are provided around the 32 light emission parts and correspond to the 32 light mission parts 100a. It is noted that each electrode pad 100b is electrically connected with the corresponding light emission part 100a by means of a wiring member (or a wiring pattern) 100c.

Figure 4:
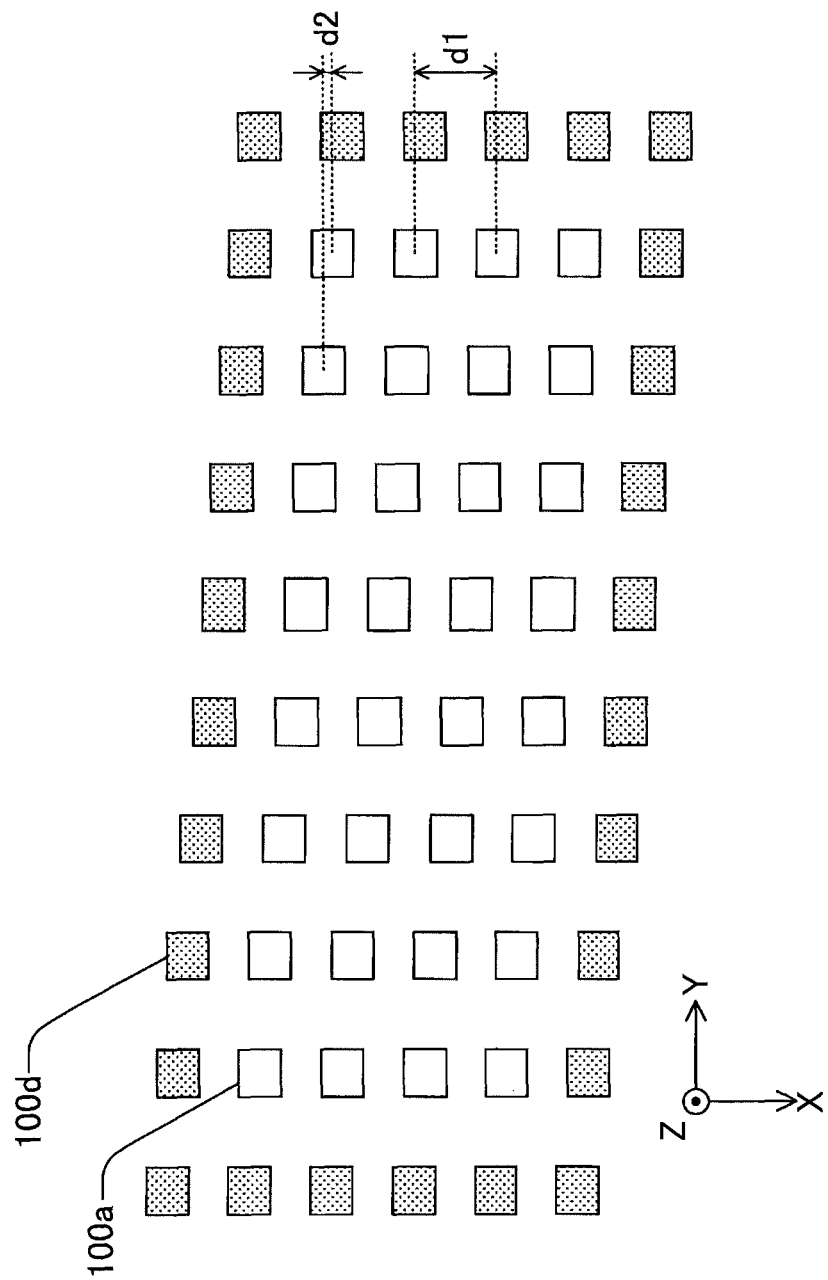
FIG. 4 illustrates a state where plural light emission parts are arranged.

The 32 light emission parts 100a are disposed in such a manner that when orthogonal projection of all the light emission parts 100a is carried out onto a virtual line extending in the X-axis direction, the intervals between the light emission parts 100a become equal (in the example of FIG. 4, "d2"). Further, dummies 100d having approximately the same shapes as those of the light emission parts 100a are formed around the 32 light emission parts 100a so that the 32 light emission parts 100a can be formed in approximately the same condition.

Figure 5:
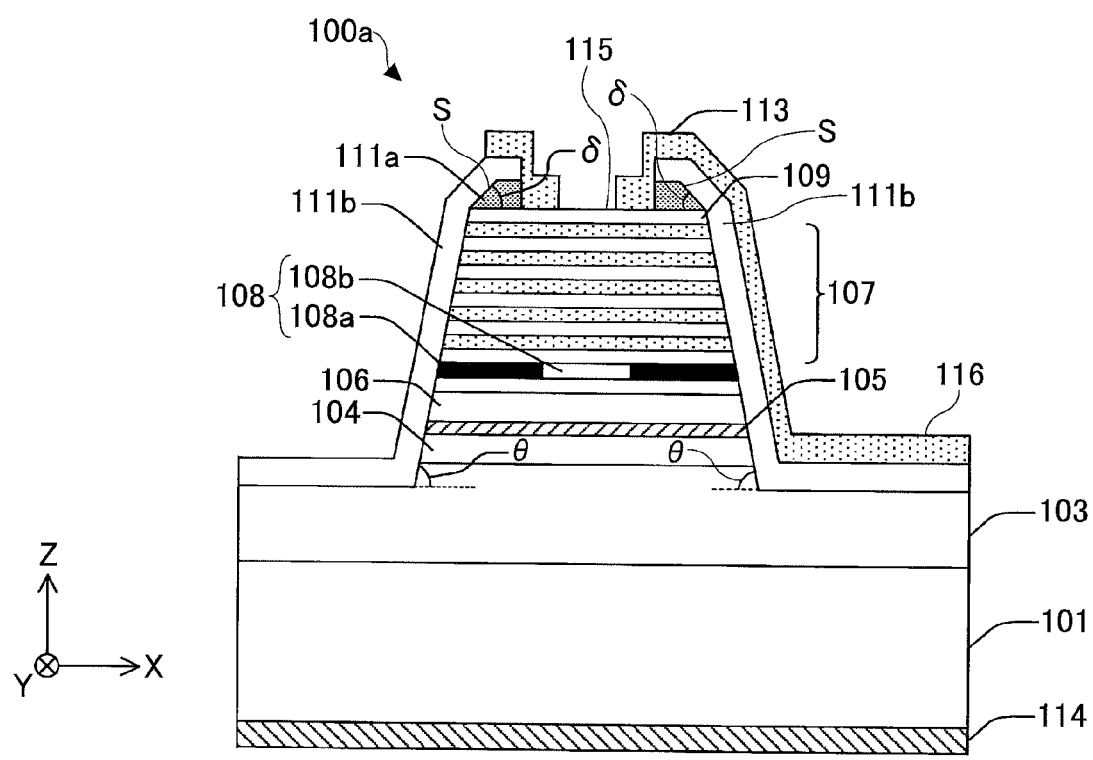
FIG. 5 illustrates a configuration of the light emission part.

Each light emission part 100a is a surface emitting laser (VCSEL: Vertical Cavity Surface Emitting Laser) having an oscillation wavelength of a 780 nm band, and, for example, as shown in FIG. 5, includes a substrate 101, a lower semiconductor DBR (Distributed Bragg Reflector) 103 (i.e., a lower reflector), a lower spacer layer 104, an active layer 105, an upper spacer layer 106, an upper semiconductor DBR 107 (i.e., an upper reflector) and a contact layer 109. It is noted that FIG. 5 is a schematic diagram provided for the purpose of easy understanding, and relationships between thicknesses of the respective layers are not accurate.

The substrate 101 is an n-GaAs single-crystal substrate.

The lower semiconductor DBR 103 is laminated on the +Z side of the substrate 101 via a buffer layer (not shown), and has 40.5 pairs, each pair including a low refractive index layer made of n-$Al_{0.9}Ga_{0.1}As$ and a high refractive index layer made of n-$Al_{0.3}Ga_{0.7}As$. Between the refractive index layers, composition gradient layers, each having a thickness of 20 nm, in which compositions are gradually changed from one composition to another composition for the purpose of reducing electric resistance, are provided. Any one of the respective refractive index layers is set to have an optical thickness of $\lambda/4$, including ½ s (i.e., halves) of both of the respective adjacent composition gradient layers, where $\lambda$ denotes the oscillation wavelength. It is noted that an optical thickness and an actual thickness of a layer have the following relationship. That is, when the optical thickness is $\lambda/4$, the actual thickness D of the layer is such that $D=\lambda/4n$, where n denotes the refractive index of the medium of the layer.

The lower spacer layer 104 is laminated on the +Z side of the lower semiconductor DBR 103 and is made of nondoped $Al_{0.6}Ga_{0.4}As$.

The active layer 105 is laminated on the +Z side of the lower spacer layer 104, and has three quantum well layers and four barrier layers. Each quantum well layer is made of $Al_{0.12}Ga_{0.88}As$, and each barrier layer is made of $Al_{0.3}Ga_{0.7}As$.

The upper spacer layer 106 is laminated on the +Z side of the active layer 105, and is made of nondoped $Al_{0.6}Ga_{0.4}As$.

The part including the lower spacer layer 104, the active layer 105 and the upper spacer layer 106 is called a resonator structure, and is set to have an optical thickness of one wavelength. It is noted that the active layer 105 is provided at a position corresponding to an anti-node in a standing wave distribution of an electric field, i.e., the middle of the resonator structure so that high stimulated emission probability can be obtained.

The upper semiconductor DBR 107 is laminated on the +Z side of the upper spacer layer 106, and has 24 pairs, each pair including a low refractive index layer made of $p-Al_{0.9}Ga_{0.1}As$ and a high refractive index layer made of $p-Al_{0.3}Ga_{0.7}As$. Between the refractive index layers, composition gradient layers, in which compositions are gradually changed from one composition to another composition for the purpose of reducing electric resistance, are provided. Each of the refractive index layers is set to have an optical thickness of $\lambda/4$, including ½ s (i.e., halves) of both of the respective adjacent composition gradient layers.

A to-be-selected oxide layer 108 made of p-AlAs is provided at a position in the upper semiconductor DBR 107 optically $\lambda/4$ away from the resonator structure. It is noted that in FIG. 5, for the sake of convenience, the to-be-selected oxide layer 108 is shown between the upper semiconductor DBR 107 and the resonator structure.

The contact layer 109 is laminated on the +Z side of the upper semiconductor DBR 107 and is made of p-GaAs.

It is noted a structure in which the plural semiconductor layers are laminated on the substrate 101 as described above will be referred to as a "laminate member" hereinafter for the sake of convenience.

Next, a method of manufacturing the surface emitting laser array 100 will be described.

Figure 6A:
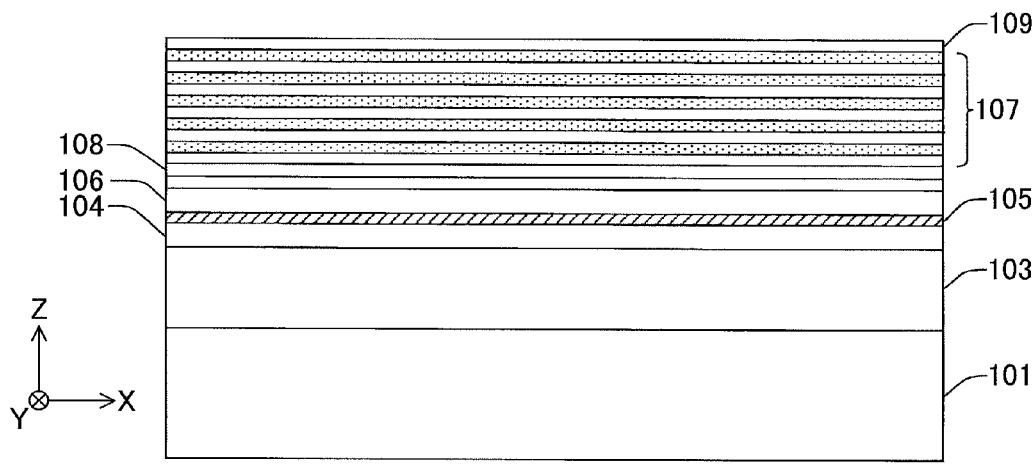
FIGS. 6A, 6B, 7A, 7B, 7C, 8A, 8B, 9A, 9B, 10A, 10B and 11 illustrate a method of manufacturing the surface emitting laser array.

(1) The above-mentioned laminate member is produced through crystal growth according to a metal organic chemical vapor deposition (MOCVD) method or a molecular beam epitaxial (MBE) method (see FIG. 6A).

Here, as raw materials of the III group, trimethyl aluminium (TMA), trimethyl gallium (TMG) and trimethylindium (TMI) are used. As raw materials of the V group, phosphine ($PH_3$) and arsine ($AsH_3$) are used. As raw materials of a p-type dopant, carbon tetrabromide ($CBr_4$) and dimethylzinc (DMZn) are used. As a raw material of an n-type dopant, hydrogen selenide ($H_2Se$) is used.

Figure 6B:
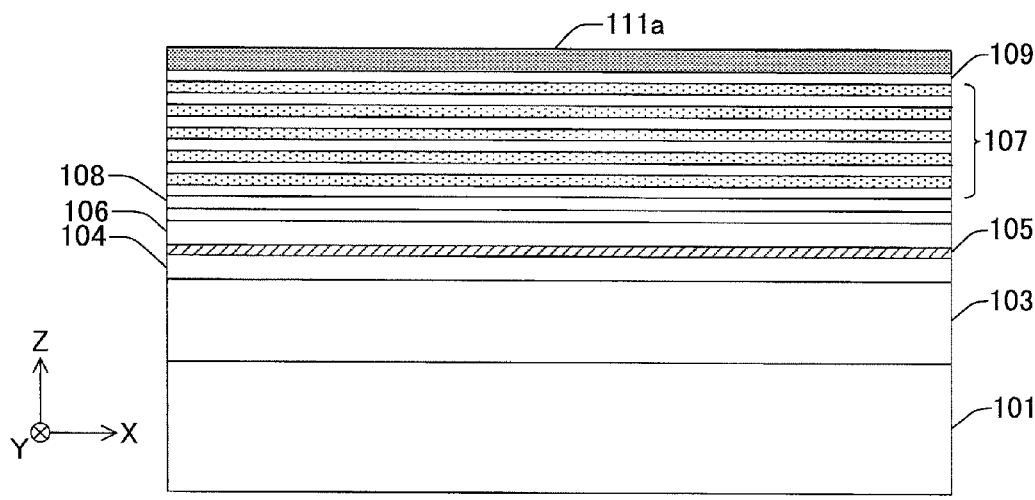

(2) A dielectric layer 111a made of $SiO_2$ is produced by using a plasma CVD method (see FIG. 6B). Here, a film thickness of the dielectric layer 111a is set as being approximately 100 nm. It is also possible to use SiN as the dielectric layer 111a. The dielectric layer 111a may be transparent.

Figure 7A:
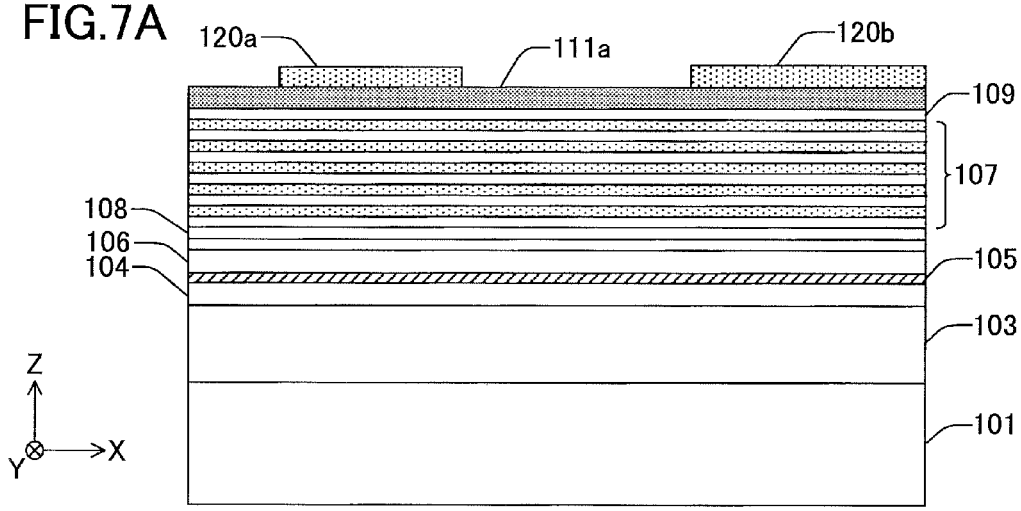

(3) Resist is coated on the surface of the dielectric layer 111a, and thus a resist pattern 120a to be used to define an outer shape of a mesa structure (hereinafter, simply referred to as a "mesa" for the sake of convenience), a resist pattern 120b to be used to mask an area in which the electrode pad 100b is to be formed, and so forth are formed (see FIG. 7A). It is noted that the mesas include not only mesas that become the light emission parts 100a but also mesas that become the dummies 100d.

Figure 7B:
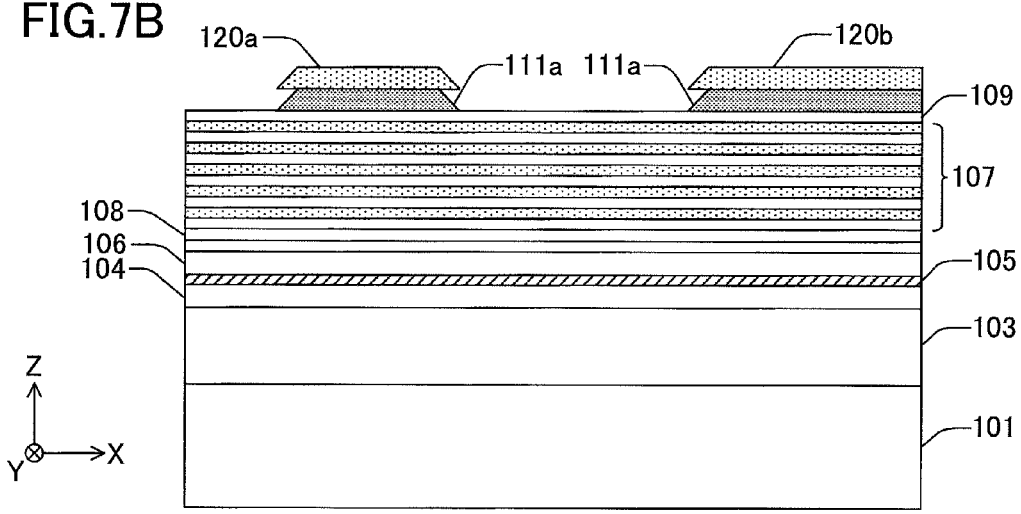
Figure 7C:
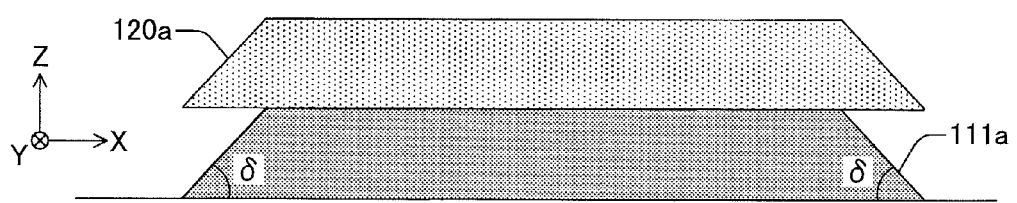

(4) According to a wet etching method, unnecessary parts of the dielectric layer 111a are removed. At this time, the end surfaces of the remaining parts of the dielectric layer 111a have tapers as shown in FIG. 7B. The slope angles (hereinafter, which may be referred to as "taper angles") of the end surfaces with respect to the X-axis are referred to as δ (see FIG. 7C). Here, buffered hydrofluoric acid solution (i.e., buffered HF) having a HF concentration on the order of 5% is used in the wet etching method, and the taper angle δ is set to be 40°. It is noted that the taper angle δ can be controlled by changing the HF concentration, the etching period of time (immersion period of time), and/or the solution temperature. As the taper angle δ, 20° through 60° are preferable.

Figure 8A:
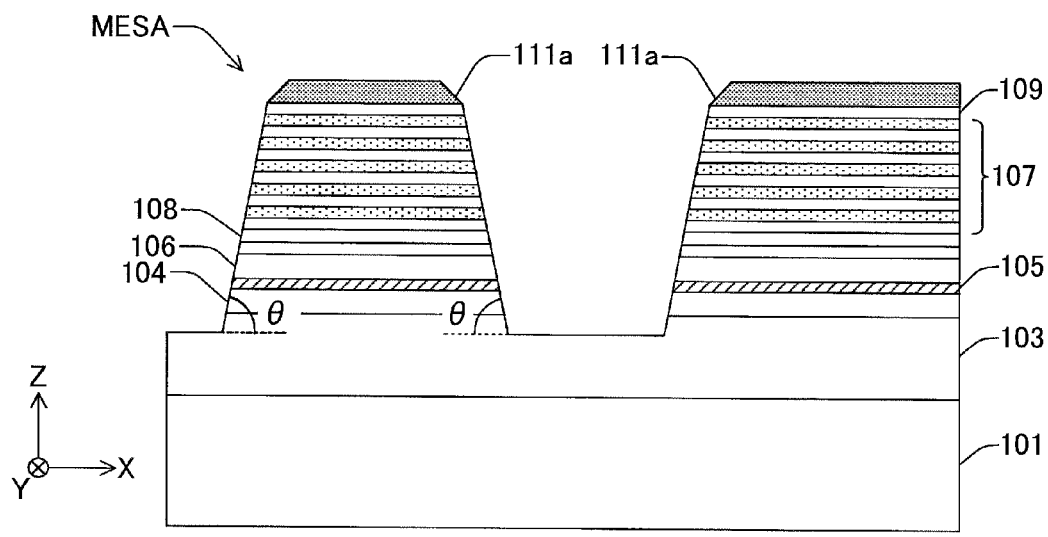
Figure 8B:
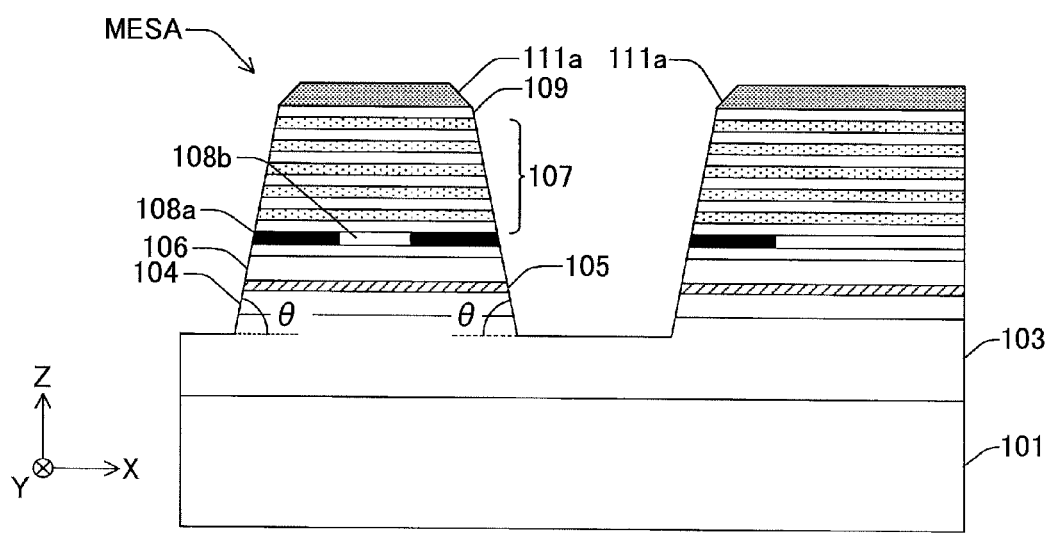

(5) According to a dry etching method in an ECR (Electron Cyclotron Resonance) method of using a $Cl_2$ gas or an ICP (Inductively Coupled Plasma) method, the laminate member is etched by using the resist pattern 120a and the resist pattern 120b as etching masks, and thus, the mesa in which at least the to-be-selectively oxidized layer 108 is exposed on the side wall is produced. Here, a bottom surface of the etching is set to be positioned in the inside of the semiconductor DBR 103 as shown in FIG. 8A. The thus-produced mesa has the side wall that is sloped with respect to the X-axis (taper shape). This taper shape can be controlled by appropriately changing a process condition such as a gas flow rate, a plasma discharge voltage, and/or substrate temperature at the time of the dry etching. By increasing the plasma discharge voltage or by reducing the substrate temperature, it is possible to reduce a slope angle θ (see FIG. 8A or 8B).

(6) The laminate member is immersed in an acetone solution and the etching masks are removed by means of ultrasonic cleaning (see FIG. 8A). As shown in FIG. 8A, the slope angle of the side wall of the mesa with respect to the X-axis is referred to as θ. Here, the slope angle θ is formed larger than the taper angle δ of the dielectric layer 111a (see FIG. 7C).

Thus, the taper angle δ of the end parts of the dielectric layer 111a is formed by the wet etching method, and the mesa slope angle θ is formed by the dry etching method. Thereby, the mesa having the relationship of δ<θ is produced. As a result of the end parts of the dielectric layer 111a having the taper angle δ being produced by the wet etching and the mesa having the slope angle θ being produced by the dry etching, it is possible to form the taper angle δ and the slope angle θ with improved controllability.

Figure 13:
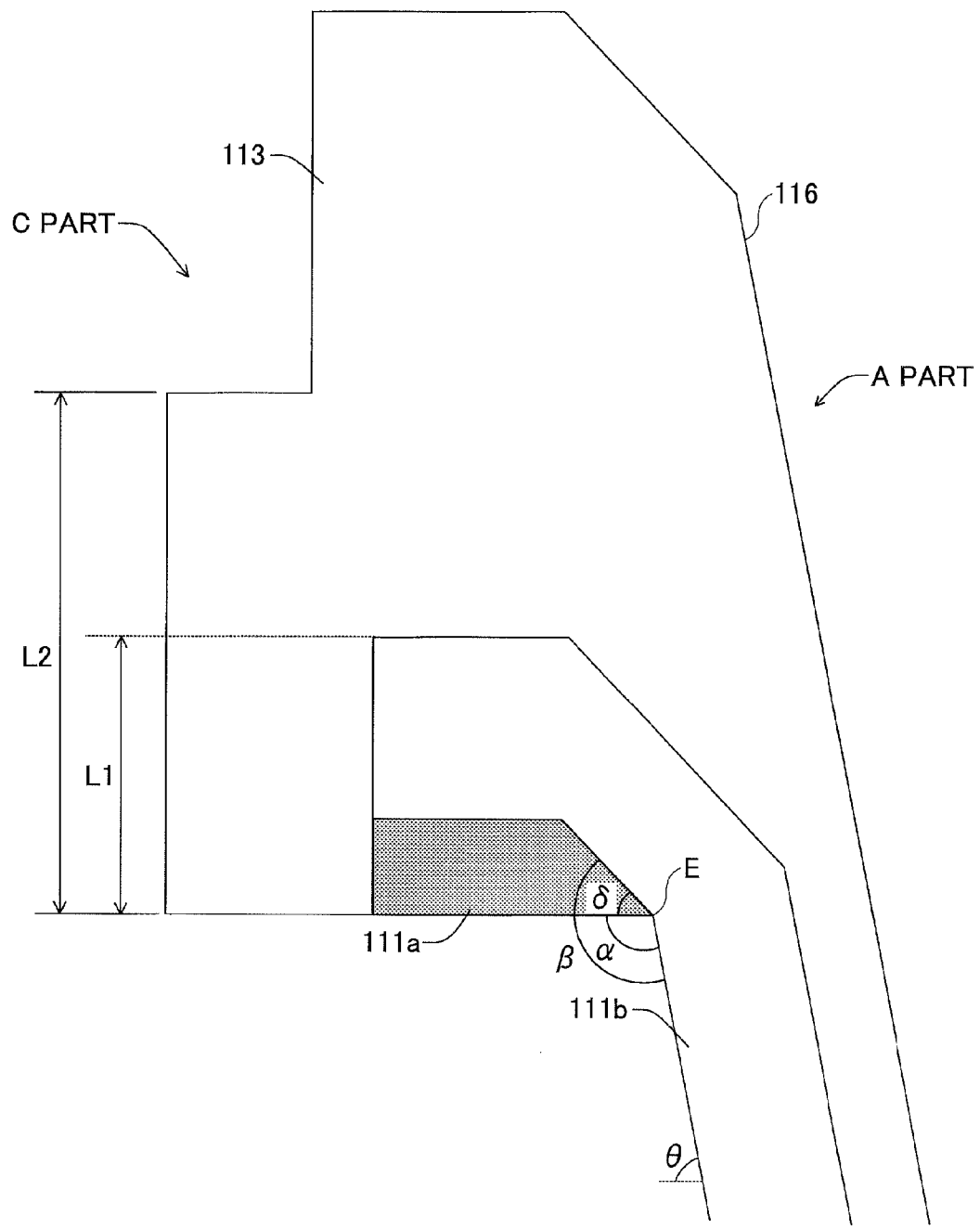
FIG. 13 shows a partial magnified view of FIG. 12.
Figure 14:
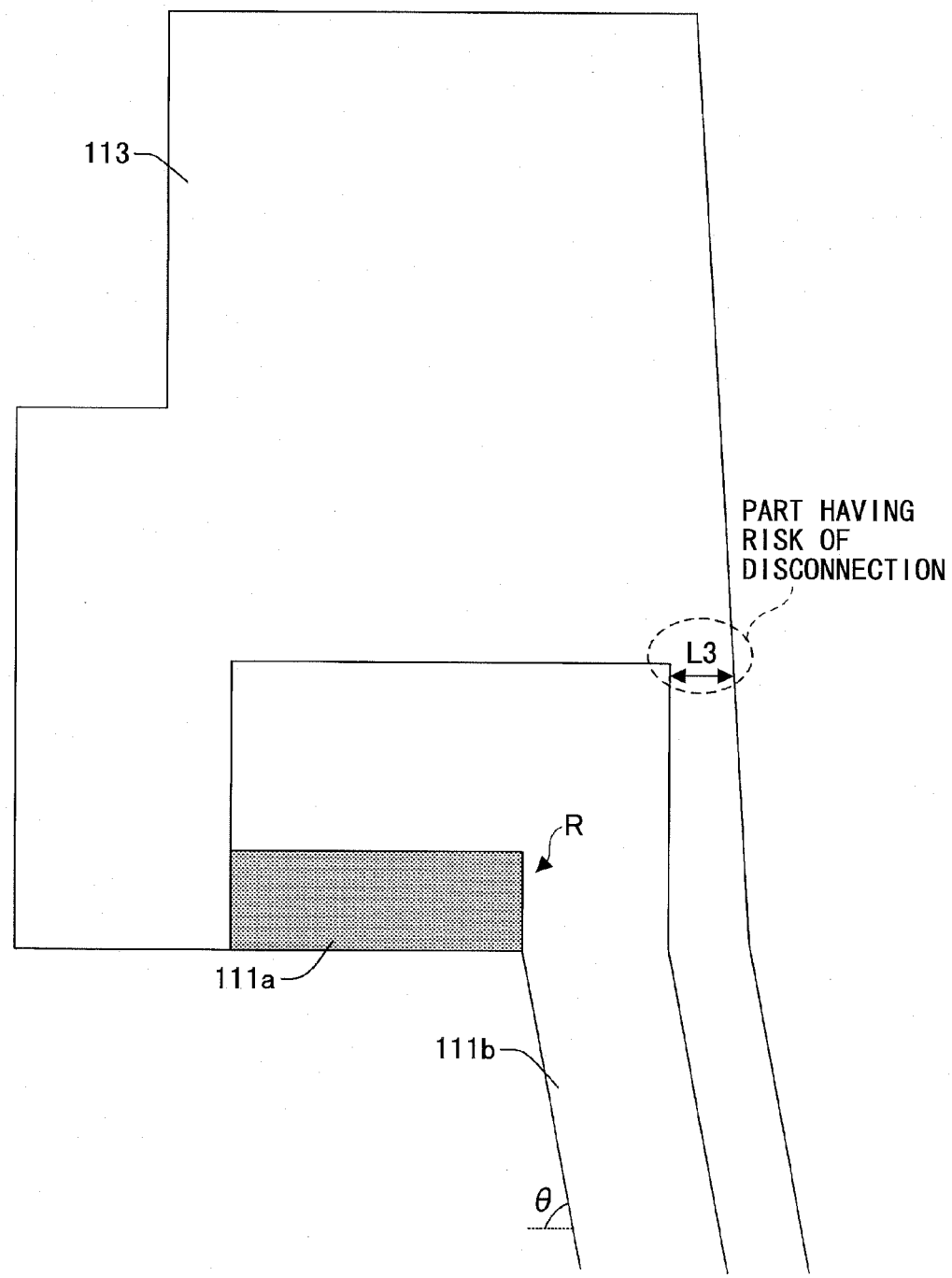
FIG. 14 illustrates a state of an electrode material and a wiring material when a tapered surface does not exist in a dielectric layer.
Figure 15:
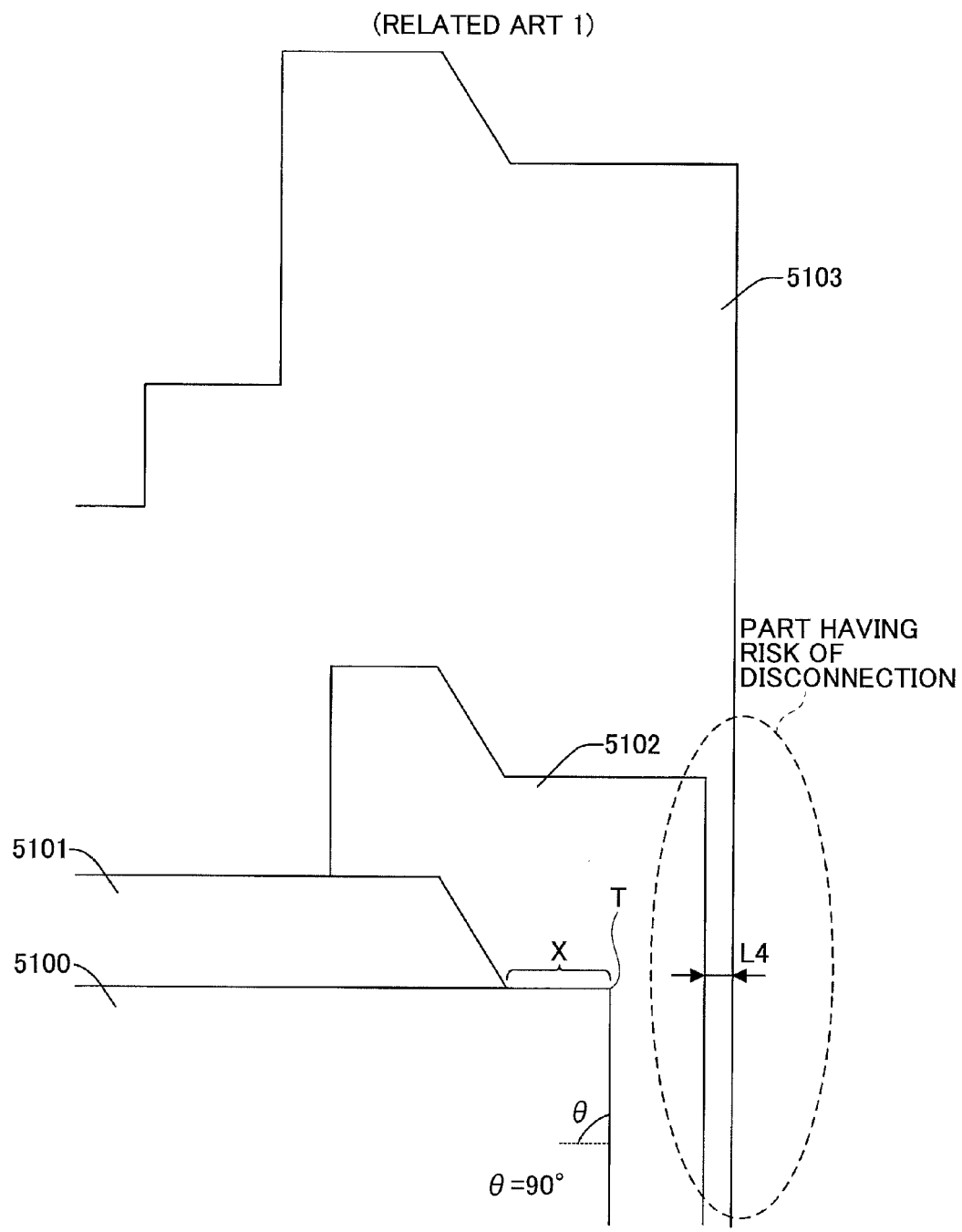
FIG. 15 illustrates a related art example 1 in which a tapered end of a contact metal does not coincide with a top end of a mesa, and a slope angle θ is 90°.

By reducing the angle δ, it is possible to form metal with a large film thickness at the "PART HAVING RISK OF DISCONNECTION" shown FIGS. 14 and 15, and thus it is possible to avoid disconnection of wiring of the metal. It is preferable that the taper angle δ is generally 20° through 60°. In a case where the taper angle δ becomes equal to or less than 20°, an angle β shown in FIG. 13 gradually approaches the supplementary angle α (i.e., the angle α at the top end part of the mesa) of the slope angle θ of the mesa, the film thickness of the metal at the "PART HAVING RISK OF DISCONNECTION" may not become large, and thus, a risk of disconnection of the wiring increases. On the other hand, when the taper angle δ becomes generally equal to or more than 60°, the taper angle δ approximates the slope angle θ of the mesa, and thus, it may not be possible to ensure a sufficient film thickness of the metal at the "PART HAVING RISK OF DISCONNECTION".

FIG. 16 shows a result of an experiment as to whether the metal wiring was disconnected when the taper angle δ was changed between 70° and 10° with the slope angle θ of the mesa being fixed at 75°.

FIG. 17 shows a result of an experiment as to whether the metal wiring was disconnected when the slope angle θ was changed between 50° and 80° by changing the condition of the dry etching with the taper angle δ of the dielectric layer 111a being fixed at 60°.

From these results of the experiments, it is seen that as the relationship of δ<θ is satisfied between the taper angle δ of the dielectric layer 111a and the slope angle θ of the mesa, no disconnection of the metal wiring occurs according to the result of the experiment of FIG. 17, and it is preferable that the taper angle δ of the dielectric layer 111a is on the order of 20° through on the order of 60° according to the result of the experiment of FIG. 16.

The angle δ formed in the wet etching can be controlled by using a difference between the etching speed (V1) in the lateral direction on the interface between the resist 120a and 120b and the dielectric layers 111a and the etching speed (V2) in the lateral direction on the interface between the dielectric layers 111a and the p-GaAs 109 that is the base layer of the dielectric layers 111a. Here, generally speaking, the etching speed V1 is higher than the etching speed V2, and by using the difference, it is possible to control the angle δ. For example, as the etching period of time becomes longer, the taper angle δ becomes smaller. The etching period of time is controlled by the concentration of the etching solution, the temperature of the etching solution, or such.

The angle θ formed in the dry etching can be controlled by controlling competition reactions of reaction products. Specifically, various process parameters such as the gas flow rate, the pressure, the discharge power, the substrate bias and/or the substrate temperature are controlled, and thus the angle θ is controlled.

(7) The laminate member is caused to undergo heat treatment in moisture. Thereby, Al (aluminium) in the to-be-selectively oxidized layer 108 is selectively oxidized from the outer circumferential part of the mesa, and thus an area 108b that has not been oxidized and is surrounded by an Al oxide 108a remains at a center part of the mesa (see FIG. 8B). That is, a so-called oxide-confined structure is formed where a path of the driving current in the light emission part 100a is restricted to the center part of the mesa. The above-mentioned area 108b that has not been oxidized acts as a current passing area.

Figure 9A:
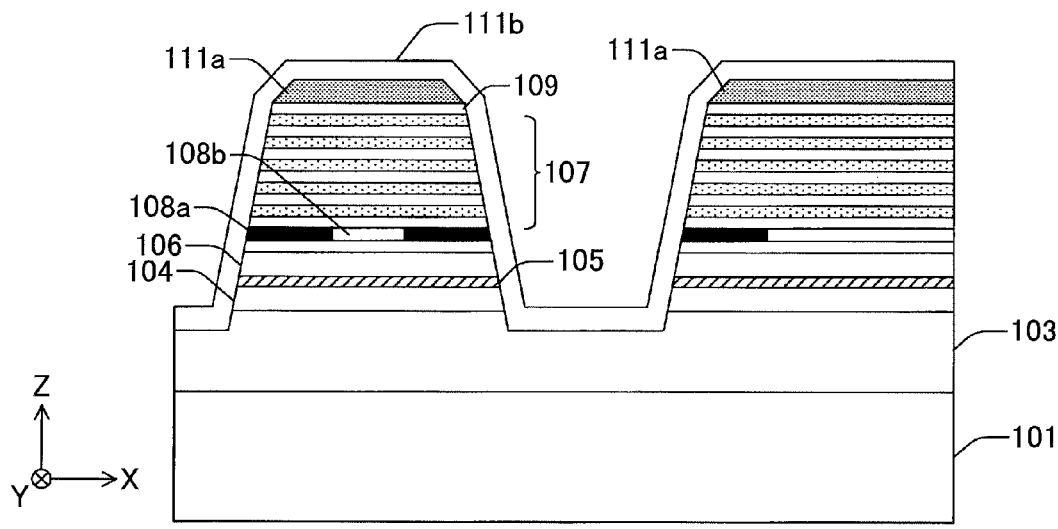

(8) By using a plasma CVD method, a protective film 111b made of $SiO_2$ is formed (see FIG. 9A). Here, a film thickness of the protective film 111b is set as being approximately 200 nm. It is noted that as the protective film 111b, a SiN film may be formed.

Figure 9B:
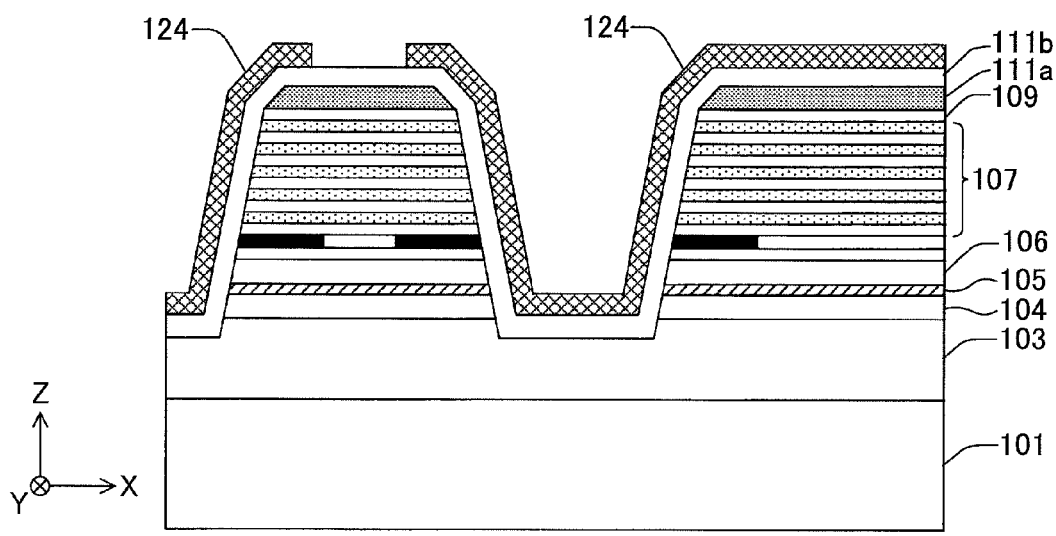

(9) A resist mask 124 for forming a contact hole for a p-side electrode 113 is formed through photolithography (see FIG. 9B).

Figure 10A:
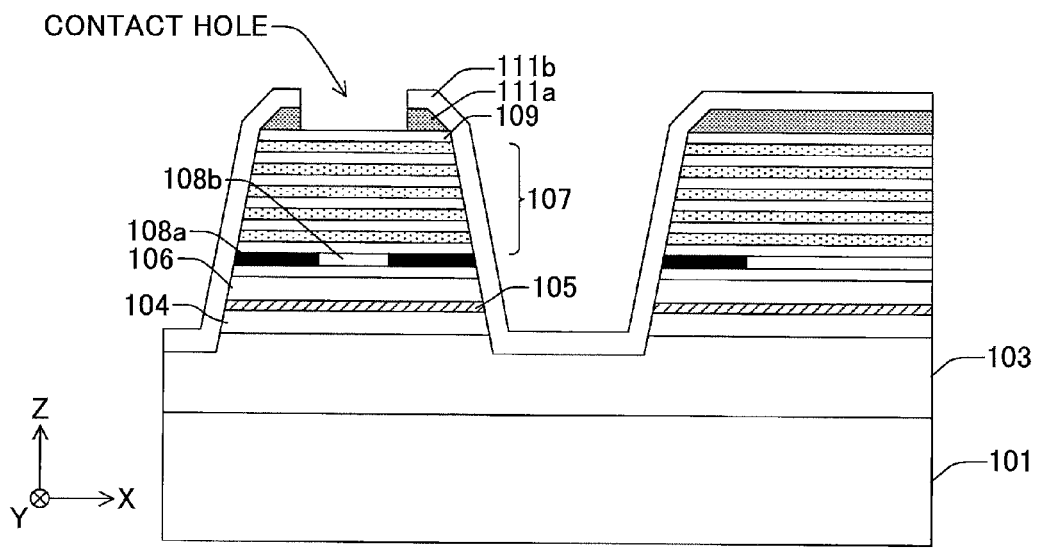

(10) The protective film 111b and the dielectric layer 111a are etched by means of BHF (buffered HF), and a window for the p-side electrode 113 is formed (see FIG. 10A).

(11) The resist mask 124 is removed (see FIG. 10A).

(12) A resist pattern is formed at an area (radiation area 115) becoming a light radiation part on the top of the mesa, the area other than where a wiring pattern 116 is to be formed, and so forth, and a p-side electrode material is deposited. As the p-side electrode material, a multilayer film made of Cr/AuZn/Au, or a multilayer film made of Ti/Pt/Au is used. Further, a thickness of the p-side electrode material is 700 nm through 900 nm. It is noted that the p-side electrode material is the same as the material of the wiring pattern 116 and the material of the electrode pad 100b.

Figure 10B:
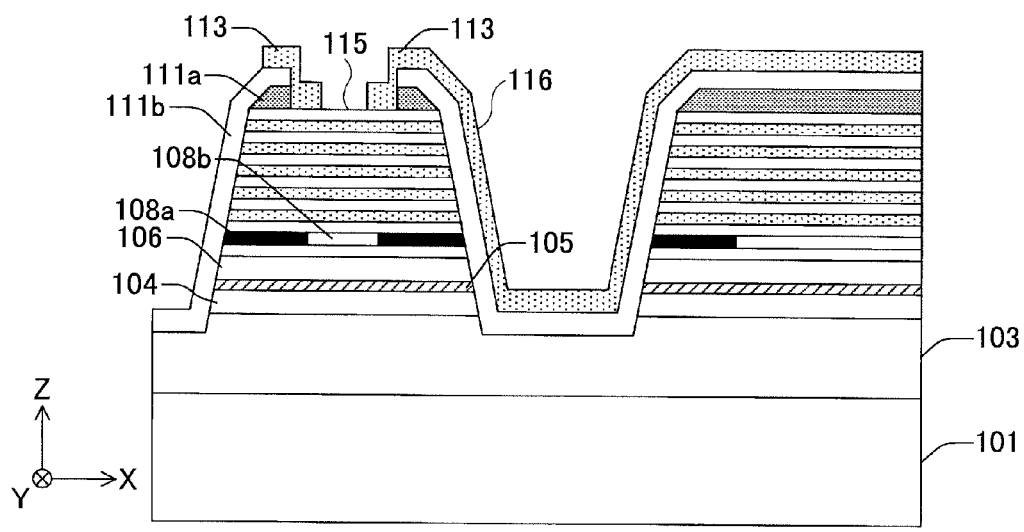

(13) Unnecessary parts of the p-side electrode material are lifted off, and thus the p-side electrode 113 and the wiring pattern 116 are formed (see FIG. 10B). The area surrounded by the p-side electrode 113 is the radiation area 115. It is noted that the p-side electrodes 113 are formed only for the mesas that become the light emission parts 100a.

Figure 11:
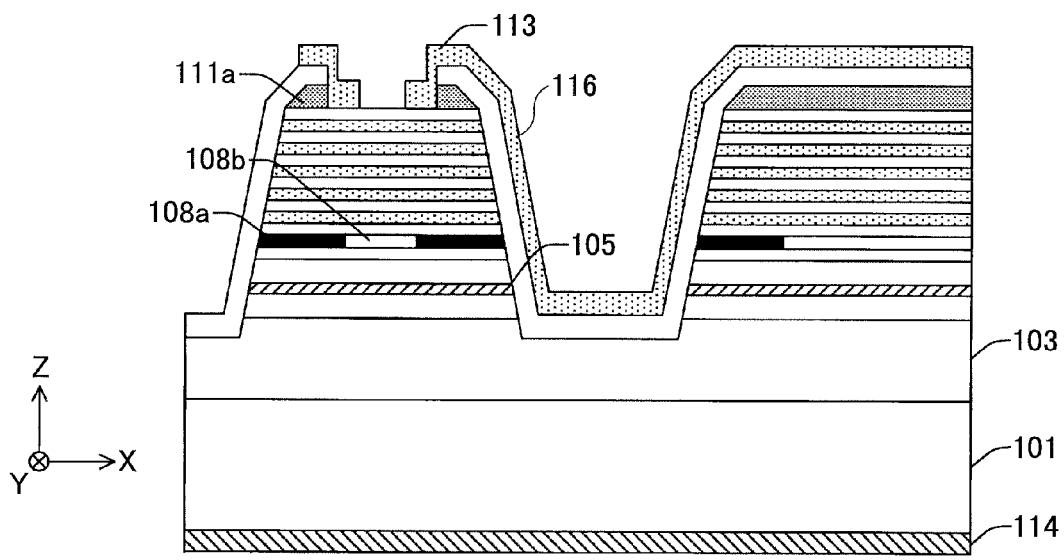

(14) The reverse side of the substrate 101 is grinded to obtain a predetermined final thickness (for example, on the order of 100 μm) of the substrate 101, and after that, an n-side electrode 114 is formed on the thus-grinded reverse side of the substrate 101 (see FIG. 11). Here, the n-side electrode 114 is a multilayer film made of AuGe/Ni/Au.

(15) Through annealing, ohmic conduction is obtained for the p-side electrode 113 and the n-side electrode 114. Thus, the mesa becomes the light emission part 100a.

(16) Cutting for respective chips is carried out.

Then, through various post processes, the surface emitting laser array 100 is obtained.

Figure 12:
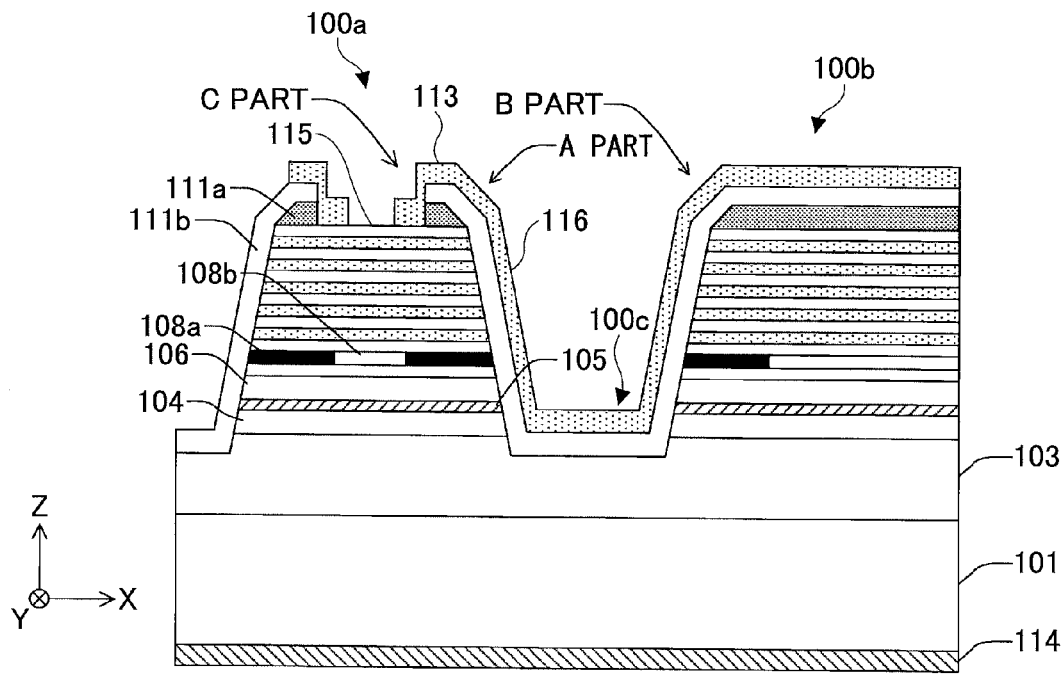
FIG. 12 illustrates a feature of the surface emitting laser array.

In the thus-obtained surface emitting laser array 100, as shown in FIG. 12, the electrode material and the wiring material are formed at an A part "A PART", a B part "B PART" and a C part "C PART" as coverage is satisfactory. "Coverage is satisfactory" means that the state of covering is satisfactory.

FIG. 13 shows a view in which the A part and the C part shown in FIG. 12 are magnified. Here, the thickness L2 (700 nm through 900 nm) of the p-side electrode material is sufficiently large with respect to the thickness L1 (approximately 300 nm) that is a sum of the thickness of the dielectric layer 111a and the thickness of the protective layer 111b, which are formed on the mesa in sequence. Also, an end part of the dielectric layer 111a coincides with a top end part of the mesa at the point "E". Therefore, no disconnection of the p-side electrode material occurs at the C part of the dielectric layer 111a. Further, also at the A part, since the thickness of the wiring material is ensured as being sufficiently large, no disconnection of the wiring material occurs. It is noted that as for the B part shown in FIG. 12, although no magnified view is shown, since the thickness of the wiring material is ensured as being sufficiently large the same as the A part, no disconnection occurs.

"The end part of the dielectric layer 111a coincides with the top end part of the mesa at the point "E"" means that the ridgeline on the end part of the dielectric layer 111a coincides with the ridgeline on the top end part of the mesa at the point "E" of FIG. 13. Thereby, it is possible to make the angles at the top end part of the mesa gentler (or blunter).

Further, even in a case where the wiring is formed to stride over the dummy 100d (see FIG. 4), no disconnection occurs in the wiring.

When the dielectric layer 111a formed on the mesa did not have the tapered surface, i.e., the end part "R" of the dielectric layer 111a had an upright (or perpendicular) wall as shown in FIG. 14, for example, such a part would exist near the top part of the side wall of the mesa where the thickness of the wiring material is small ("L3" at the "PART HAVING RISK OF DISCONNECTION").

On the other hand, in the related art example 1 shown in FIG. 15, on the top of a mesa 5100 having a slope angle θ of 90° (i.e., perpendicular), an end of a contact metal 5101 having a taper shape is formed at a position a distance "X" away from the top end part "T" of the mesa 5100. Further, an interlayer dielectric film 5102 is formed on an area "X" at which the part of the top end surface of the mesa is exposed, and a metal wiring 5103 is formed on the interlayer dielectric film 5102. In this case of the surface emitting laser, the thickness of the wiring material becomes smaller ("L4") at the area of the "PART HAVING RISK OF DISCONNECTION" including the side wall of the mesa 5100. Thus, it may be difficult to manufacture the surface emitting laser with a high yield.

Figure 18:
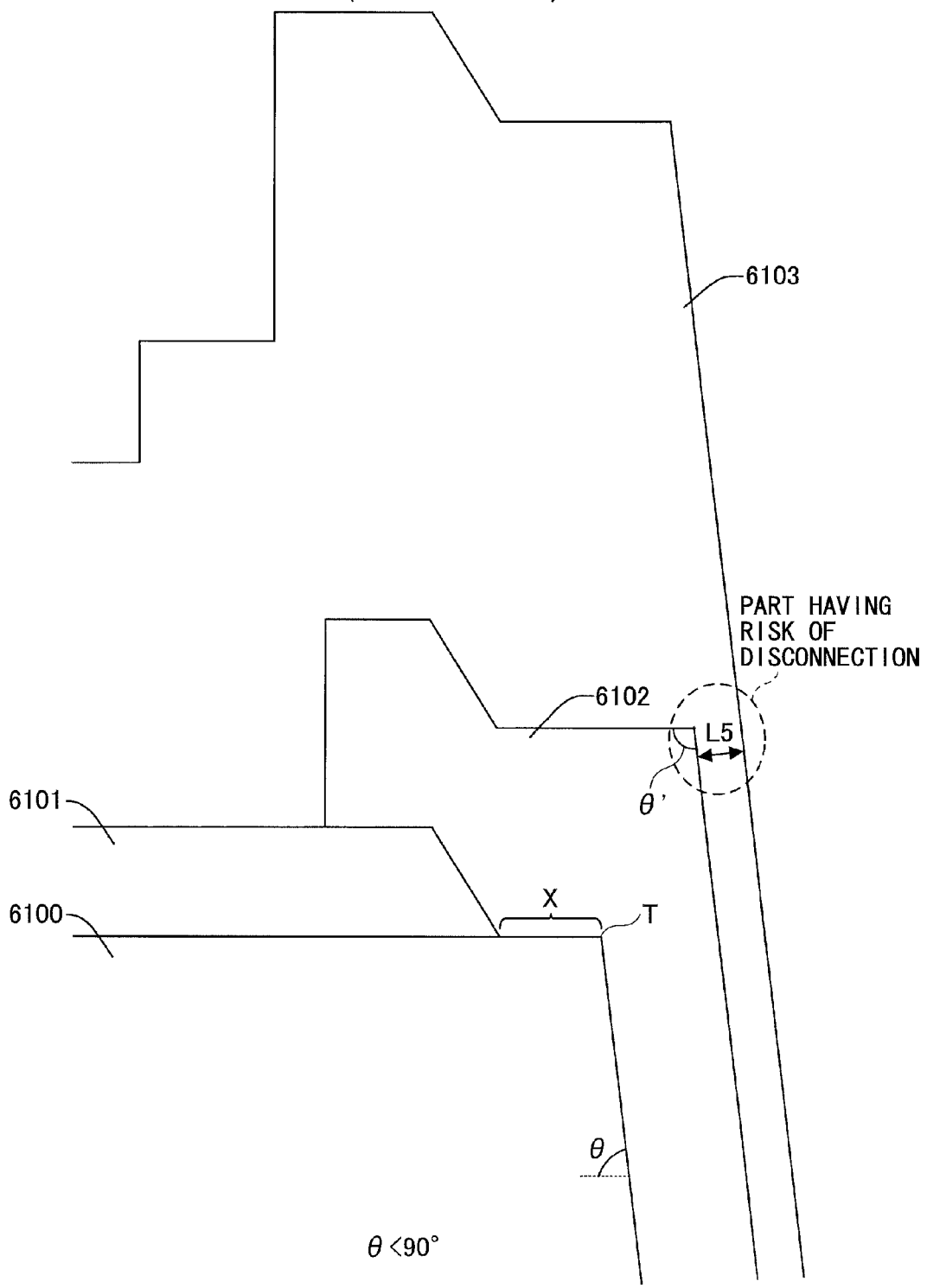
FIG. 18 illustrates a related art example 2 in which a tapered end of a contact metal does not coincide with a top end of a mesa, and a slope angle θ is less than 90°.

In a related art example 2 shown in FIG. 18, on the top of a mesa 6100 having a slope angle θ less than 90°, an end of a contact metal 6101 having a taper shape is formed at a position a distance "X" away from the top end part "T" of the mesa 6100. Further, an interlayer dielectric film 6102 is formed on an area "X" at which the part of the top end of the mesa is exposed, and a metal wiring 6103 is formed on the interlayer dielectric film 6102. In this case of the surface emitting laser, an angle θ', reflecting the slope angle θ of the mesa, exists on the surface of the interlayer dielectric film 6102 at the area of the "PART HAVING RISK OF DISCONNECTION". As a result, the thickness of the wiring material becomes smaller ("L5") at this area and a disconnection may be likely to occur, so that it may be difficult to manufacture the surface emitting laser with a high yield.

It is noted that, in a vacuum evaporation method, because in a range of straightness of metal particles, the metal particles are not likely to be deposited on a surface parallel to the range direction. Therefore, PART HAVING RISK OF DISCONNECTION may be produced.

As can be seen from the above description, the method of manufacturing a surface emitting laser element according to the embodiment of the present invention is used for manufacturing the above-described surface emitting laser array 100.

As described above, as shown in FIG. 5, the surface emitting laser array 100 includes the light emission part 100a that includes the substrate 101, the lower semiconductor DBR 103, the resonator structure including the active layer 105, the upper semiconductor DBR 107 and the contact layer 109.

The peripheral part of the top surface of the mesa is covered by the dielectric layer 111a having the tapered surface "S" (see FIG. 5) where the thickness of the dielectric layer 111a gradually decreases in the direction toward the outermost part, and the end part of the dielectric layer 111a coincides with the top end part of the mesa. As a result, also the protective film 111b is formed in such a state of being sloped with respect to the surface of the substrate 101 by an angle similar to the taper angle δ of the dielectric layer 111a at the peripheral part of the top surface of the mesa. Further, since the wiring material of the wiring pattern 116 is deposited onto the protective film 111b, also the wiring material is deposited in such a state of being sloped with respect to the surface of the substrate 101 by an angle similar to the taper angle δ of the dielectric layer 111a at the peripheral part of the top surface of the mesa. Further, the taper angle δ of the dielectric layer 111a is set to be smaller than the slope angle θ of the side wall of the mesa with respect to the surface of the substrate 101.

In this case, it is possible to form the wiring pattern 116 with satisfactory coverage, and improve yield, i.e., reliability, in the manufacturing. Thus, it is possible to provide surface emitting laser arrays having high reliability at low cost.

At the areas indicated as the "PART HAVING RISK OF DISCONNECTION" in the related art example 1 and the related art example 2 mentioned above, wiring formed by the vacuum evaporation method may become thinner because deposition of metal particles may be reduced. Thus, a disconnection of the wiring is likely to occur.

On the other hand, the embodiment shown in FIG. 5, for example, has the shape with which metal particles are likely to be deposited, and thus, a disconnection of the wiring pattern 116 is not likely to occur. Further, the protective film 111b is used for covering before the wiring material is deposited on the side wall of the mesa. Then, it is possible to improve coatability of metal particles for depositing the wiring material on the side wall of the mesa by forming the shape of the protective film 111b such that the angle of the protective film 111b changes gradually with a certain curvature at the peripheral part of the top surface of the mesa (see FIG. 5).

Thus, in the surface emitting laser array 100, the peripheral part of the top surface of the mesa is covered by the two-layer structure including the dielectric layer 111a and the protective film 111b. It is noted that generally speaking, in the surface emitting laser arrays in the related art, the peripheral part of the top surface of the mesa is covered only by the protective film.

Further, according to the optical scanning unit 1010 (see FIG. 2) according to the embodiment, the light source 14 has the surface emitting laser array 100. Therefore, it is possible that the optical scanning unit 1010 stably carries out optical scanning with high precision.

Further, as the surface emitting laser array 100 includes the plural light emission parts 100a (see FIG. 3), it is possible that the optical scanning unit 1010 can carry out optical scanning with plural beams of light simultaneously. Thus, it is possible to improve the speed of forming an image in the laser printer 1000 (see FIG. 1) using the optical scanning unit 1010.

Further, in the laser printer 1000 according to the embodiment, since the laser printer 1000 includes the optical scanning unit 1010, consequently it is possible that the laser printer 1000 can stably form an image with high quality.

As shown in FIG. 4, in the surface emitting laser array 100, the intervals of the light emission parts 100a are the equal intervals (d2) when orthogonal projection of all the light emission parts 100a is carried out onto a virtual line extending in the sub-scan correspondence direction. Therefore, by controlling the timing of light emission in the light emission parts 100a, it is possible to regard the configuration of the surface emitting laser array 100 as if the light emission parts 100a are disposed in the sub-scan direction at the equal intervals on the surface of the photosensitive drum 1030.

Further, for example, assuming that the above-mentioned interval d2 is 2.65 μm and the magnification of the optical system in the optical scanning unit 1010 is 2, it is possible to carry out high-density writing of 4800 dpi (dots per inch). Further, it is possible to further improve the density of writing and carry out printing with higher quality by providing such an array configuration to increase the number of the light emission parts 100a in the main scan correspondence direction and/or further reduce the interval d2 by narrowing the pitch d1 in the sub-scan correspondence direction (see FIG. 4), or reducing the magnification of the optical system. It is noted that the writing intervals in the main scan direction can be easily controlled by controlling the timing of light emissions of the light emission parts 100a.

Further, in this case, it is possible to carry out printing without reducing the printing speed even when the dot density increases in the laser printer 1000. Further, it is possible to further increase the printing speed in a case where the dot density is fixed.

Figure 19:
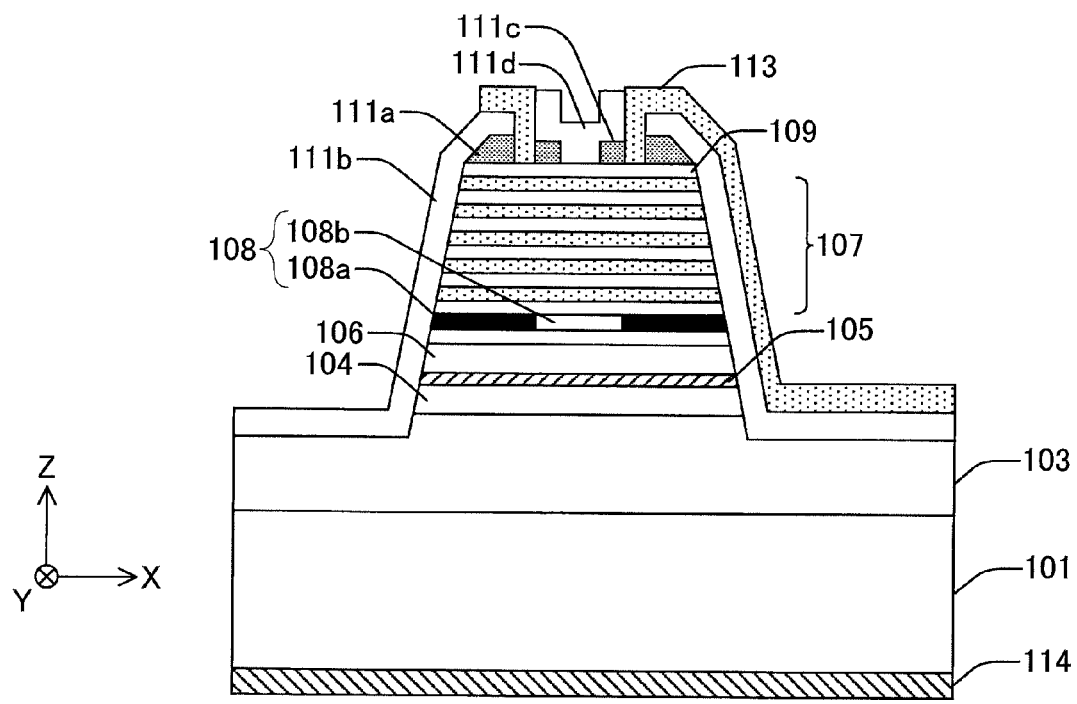
FIG. 19 illustrates a surface emitting laser array in a variant embodiment 1 of the embodiment.

It is noted that in the above-mentioned embodiment, as shown in FIG. 19, for example, a center part within the radiation area may be covered by a dielectric layer 111d having an optical thickness of an even multiple of λ/4, and a peripheral part within the radiation area may be covered by two layers, i.e., a dielectric layer 111c having an optical thickness of an odd multiple of λ/4 and the dielectric layer 111d having an optical thickness of an even multiple of λ/4. In this case, reflectance at the peripheral part within the radiation area is reduced, and it is possible to inhibit generation of a high-order transverse mode without reducing light intensity in the fundamental transverse mode. At this time, the dielectric layers may be made of silicon nitride (SiN).

Figure 20:
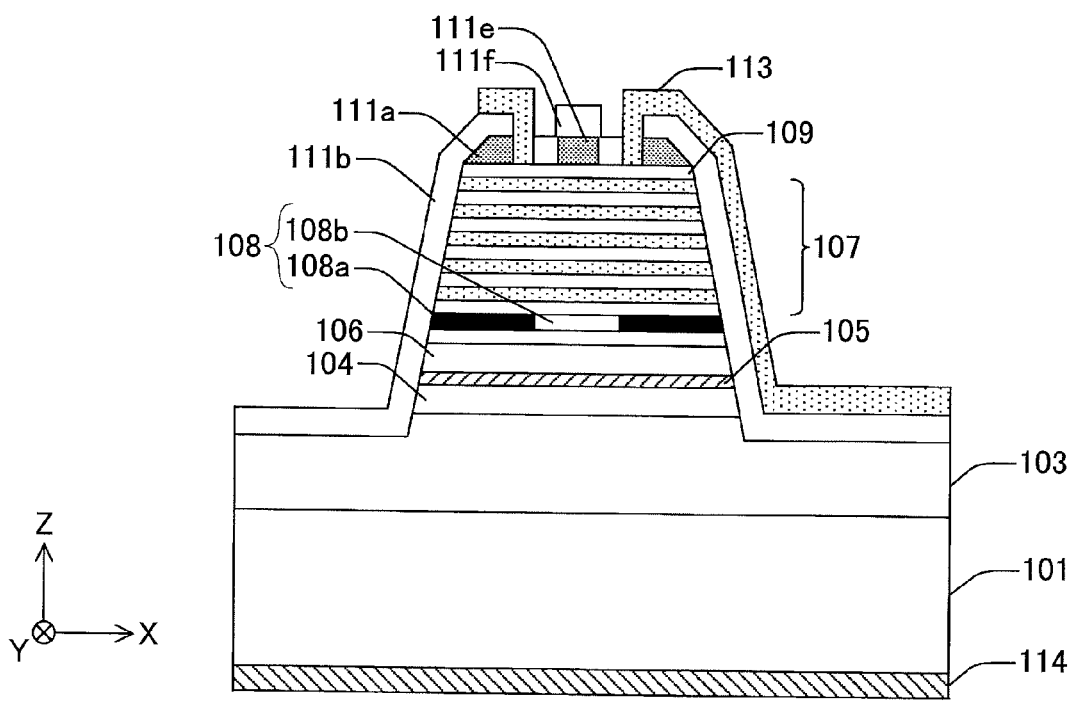
FIG. 20 illustrates a surface emitting laser array in a variant embodiment 2 of the embodiment.

Further, in the above-mentioned embodiment, as shown in FIG. 20, for example, the center part within the radiation area may be covered by two layers, i.e., a dielectric layer 111e and a dielectric layer 111f each having an optical thickness of an odd multiple of λ/4, and the peripheral part within the radiation area may be covered by the dielectric layer 111f having an optical thickness of an odd multiple of λ/4. In this case, reflectance at the center part within the radiation area increases and reflectance at the peripheral part within the radiation area is reduced. Then, it is possible to inhibit generation of a high-order transverse mode without reducing light intensity in the fundamental transverse mode. At this time, the dielectric layer 111e may be made of silicon oxide (SiO) and the dielectric layer 111f may be made of silicon nitride (SiN).

Further, in the above-mentioned embodiment, description has been made for the case where the oscillation wavelength of each light emission part 100a is of the 780 nm band. However, it is not necessary to be limited to this example. Depending on the characteristics of the photosensitive member, the oscillation wavelength of each light emission part 100a may be changed.

Further, in the above-mentioned embodiment, description has been made for the case where the surface emitting laser array 100 includes the 32 light emission parts 100a. However, it is not necessary to be limited to this example.

Further, in the above-mentioned embodiment, a surface emitting element including the single light emission part 100a may be used instead of the surface emitting laser array 100.

Further, in the above-mentioned embodiment, description has been made for the case where the optical scanning unit 1010 is used in the printer. However, the optical scanning unit 1010 may be used also in an image forming apparatus other than the printer, for example, a copier, a facsimile machine, or a multifunction peripheral (MFP) in which at least two of a printer, a copier, a facsimile machine, and so forth are combined.

Further, in the above-mentioned embodiment, description has been made for the case of the laser printer 1000 as an image forming apparatus. However, it is not necessary to be limited to this example.

For example, the embodiment of the present invention may be applied also to an image forming apparatus in which laser light is emitted directly to a medium (for example, paper) in which color developing occurs due to the laser light.

For example, the medium may be a printing plate known as a CTP (Computer To Plate). That is, in this example, the optical scanning unit 1010 directly forms an image on printing plate material according to a laser ablation method, and thus produces the printing plate. The embodiment is thus preferable to be applied also to such a type of an image forming apparatus.

Further, an image forming apparatus according to an embodiment of the present invention may be one which emits laser light directly to a medium (for example, paper) in which reversibility can be given to color developing by means of laser light.

For example, the medium may be so-called rewritable paper. The rewritable paper is such that, for example, on a base such as paper, a resin film, or such, material described later is coated as a recording layer. Then, through thermal energy control by using laser light, reversibility is given to color developing, and displaying and erasing are carried out reversibly.

For this purpose, either one of a transparency/opacity type rewritable marking method and a color developing and reducing type rewritable marking method using leuco dye may be used.

According to the transparency/opacity type rewritable marking method, fine particles of fatty acid are dispersed in a polymer thin film, and the polymer thin film is then heated to equal to or more than 110° C. Thereby, resin expands as a result of the fatty acid melting. Then, the polymer thin film is cooled. Thereby, the fatty acid enters a supercooled state and exists as a solution, and the resin having expanded is solidified. After that, the fatty acid solidifies and shrinks to become fine particles of polycrystal, and voids are created between the resin and the fine particles. Because of the voids, light is diffused, and the medium seems to be white. Next, when the medium is heated to erasing temperature of 80° C. through 110° C. the fatty acid is partially melted, the resin thermally expands, and the voids are filled with the resin. When the medium is cooled from this state, the medium enters a transparent state, and an image on the medium is erased.

According to the rewritable marking method using leuco dye, reversibly color developing and fading reactions of a colorless leuco dye and a color developing and erasing agent having a long chain alkyl group are used. The leuco dye and the color developing and erasing agent react and color developing occurs when the medium is heated by laser light, and the state is maintained when the medium is rapidly cooled as it is. When the medium is heated and then is slowly cooled, phase separation occurs because of the autoagglutination action of the long chain alkyl group of the color developing and erasing agent, the leuco dye and the color developing and erasing agent are physically separated, and thus color erasing is carried out.

Further, the medium may be so-called color rewritable paper such that a photochromic compound in which color developing into C (cyan) occurs when ultraviolet light is applied and color erasing is carried out by visible light of R (red), a photochromic compound in which color developing into M (magenta) occurs when ultraviolet light is applied and color erasing is carried out by visible light of G (green) and a photochromic compound in which color developing into Y (yellow) occurs when ultraviolet light is applied and color erasing is carried out by visible light of B (blue) are provided on a base such as paper or a resin film.

This medium may be used in such a manner that first the medium is made to become inky black as a result of ultraviolet light being applied, and then it is possible to cause the medium to express full color by controlling color optical densities of three types of materials which develop the Y, M and C colors, respectively, with periods of time and strengths of applying the light of the R, G and B colors. Further, by continuously applying strong light of the R, G and B colors onto the medium, it is also possible to cause the medium to become pure white as a result of all of the respective Y, M and C colors of the three types of materials being erased.

An image forming apparatus such as those described above that give reversibility to color developing by means of optical energy control can be realized by an image forming apparatus using an optical scanning unit such as that according to the embodiment mentioned above.

Further, an image forming apparatus according to an embodiment of the present invention may be one using a silver film as an image carrying member. In this example, a latent image is formed on the silver film by means of optical scanning, and the latent image can be visualized by a process the same as a development process in a common silver halide photographic process. Then, it is possible to transfer the visualized image to photographic paper through a process similar to a printing process in the common silver halide photographic process. Such an image forming apparatus may be realized as an optical plate making apparatus, or an optical drawing apparatus that draws an image produced by CT (Computerized Tomography) scanning, or such.

Figure 21:
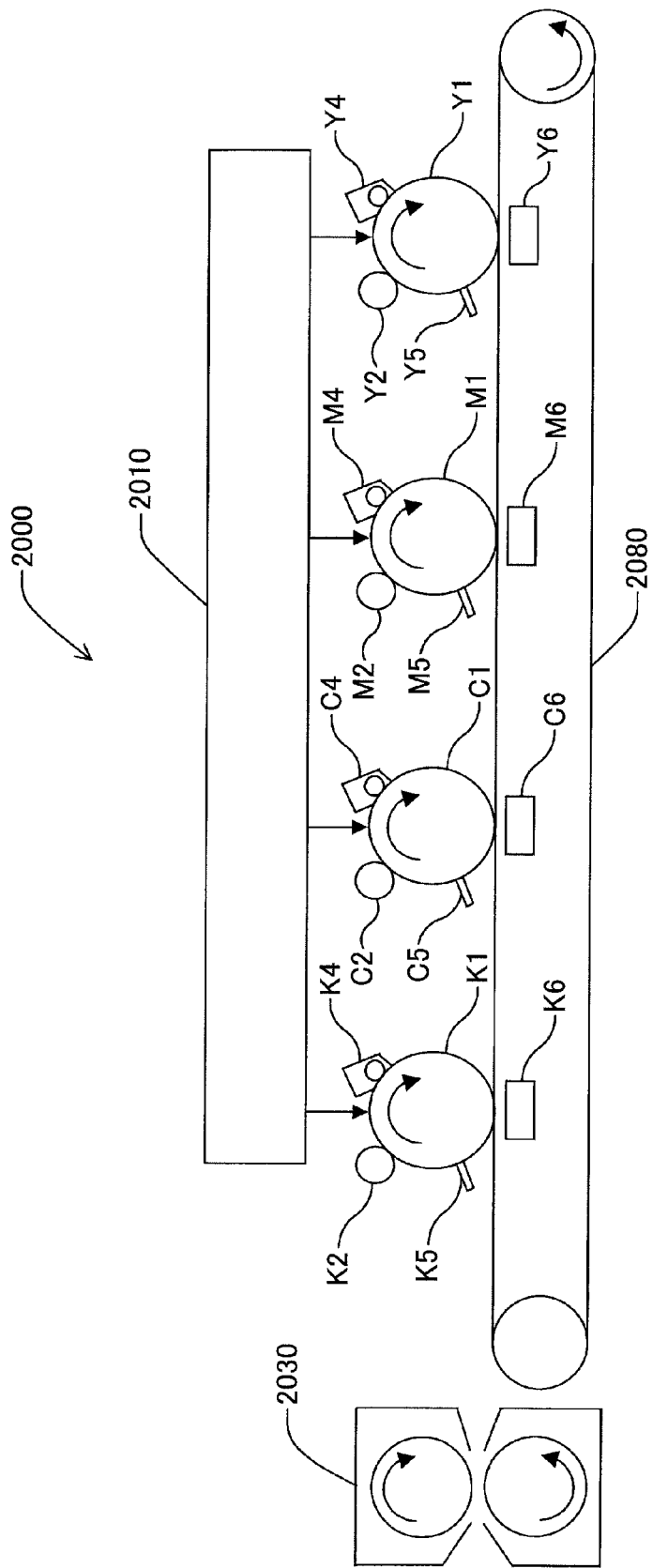
FIG. 21 illustrates a schematic configuration of a color printer in a variant embodiment 3 of the embodiment.

Further, as shown in FIG. 21 for example, an image forming apparatus according to an embodiment of the present invention may be a color printer 2000 including plural photosensitive drums.

The color printer 2000 is a tandem-type multicolor color printer which forms a full color image by superposing images of four colors (i.e., black, cyan, magenta and yellow). The color primer 2000 includes a photosensitive drum K1 (i.e., an image carrying member), an electrification unit K2, a development unit K4, a cleaning unit K5 and a transfer unit K6 for black; a photosensitive drum C1 (i.e., an image carrying member), an electrification unit C2, a development unit C4, a cleaning unit C5 and a transfer unit C6 for cyan; a photosensitive drum M1 (i.e., an image carrying member), an electrification unit M2, a development unit M4, a cleaning unit M5 and a transfer unit M6 for magenta; and a photosensitive drum Y1 (i.e., an image carrying member), an electrification unit Y2, a development unit Y4, a cleaning unit Y5 and a transfer unit Y6 for yellow. The color printer 2000 further includes an optical scanning unit 2010, a transfer belt 2080 and a fixing unit 2030.

Each photosensitive drum is rotated in a direction indicated by a corresponding arrow shown in FIG. 21, and the corresponding electrification unit, development unit, transfer unit and cleaning unit are disposed around the photosensitive drum along the rotation direction. Each electrification unit uniformly electrifies the surface of the corresponding photosensitive drum. Light is emitted by the optical scanning unit 2010 to the surface of each photosensitive drum that has been electrified by the corresponding electrification unit, and a latent image is formed on the surface of the photosensitive drum. Then, a toner image is formed on the surface of each photosensitive drum by means of the corresponding development unit. Further, by means of the corresponding transfer units, the toner images of the respective colors are transferred from the surfaces of the photosensitive drums K1, C1, M1 and Y1 onto a sheet of recording paper on the transfer belt 2080 in a superposing manner, and finally, the thus-obtained full color image is fixed onto the sheet of recording paper.

The optical scanning unit 2010 has four light sources, for the respective colors, i.e., K, C, M and Y, the light sources being the same as the light source 14 mentioned above (see FIG. 2). Therefore, the optical scanning unit 2010 can provide advantageous effects the same as those of the optical scanning unit 1010 that includes the light source 14. Further, the color printer 2000 includes the optical scanning unit 2010, and thus can provide advantageous effects the same as those of the laser printer 1000 that includes the optical scanning unit 1010.

It is noted that in the color printer 2000, out of color registration may occur because of possible manufacturing errors and/or position errors of respective parts/components. Even in a case where out of color registration occurs, it is possible to reduce the out of color registration by selecting the appropriate light emission parts 100a that are to be caused to emit light.

As described above, the surface emitting laser elements and the surface emitting laser arrays in the embodiments of the present invention are suitable to manufacture with high yield. Further, the optical scanning units in the embodiments of the present invention are suitable to stably carry out optical scanning with high precision. Further, the image forming apparatuses in the embodiments of the present invention are suitable to stably form an image with high quality. Further, the method of manufacturing a surface emitting laser element according to the embodiment is suitable to manufacture the surface emitting laser element with high yield.

The present invention is not limited to the specifically disclosed embodiments, and variations and modifications may be made without departing from the scope of the present invention.

The present application is based on Japanese Priority Patent Applications Nos. 2010-133466 and 2011-084985, filed on Jun. 11, 2010 and Apr. 7, 2011, respectively, the entire contents of which are hereby incorporated herein by reference.

What is claimed is:

1. A surface emitting laser element comprising a light emission part having a mesa structure, the light emission part including:
    a lower reflector;
    a resonator structure including an active layer; and
    an upper reflector, wherein
    the lower reflector, the resonator structure and the upper reflector are laminated on a substrate,
    a peripheral part of a top surface of the mesa structure is covered by a dielectric layer that has a tapered surface where a thickness of the dielectric layer decreases in a direction toward an outermost part, a taper angle of the tapered surface with respect to a surface of the substrate is smaller than a slope angle of a side wall of the mesa structure with respect to the surface of the substrate, and an end part of the dielectric layer coincides with an end part of the upper reflector.

2. The surface emitting laser element as claimed in claim 1, wherein
    the dielectric layer and the side wall of the mesa structure are covered by a protective film.

3. The surface emitting laser element as claimed in claim 1, wherein
    the dielectric layer is made of silicon nitride or silicon oxide.

4. A surface emitting laser array comprising:
    plural of the surface emitting laser element claimed in claim 1, wherein
    the surface emitting laser elements are integrated.

5. An optical scanning unit that scans a to-be-scanned surface with light, comprising:
    a light source having the surface emitting laser element claimed in claim 1;
    a deflector that deflects light emitted by the light source; and
    a scanning optical system that condenses the light deflected by the deflector onto the to-be-scanned surface.

6. An optical scanning unit that scans a to-be-scanned surface with light, comprising:
    a light source having the surface emitting laser array claimed in claim 4;
    a deflector that deflects light emitted by the light source; and
    a scanning optical system that condenses the light deflected by the deflector onto the to-be-scanned surface.

7. An image forming apparatus comprising:
    at least one image carrying member; and
    at least the one optical scanning unit, claimed in claim 5, which scans the at least one image carrying member with light that has been modulated according to image information.

8. An image forming apparatus comprising:
    at least one image carrying member; and
    at least the one optical scanning unit, claimed in claim 6, which scans the at least one image carrying member with light that has been modulated according to image information.

9. The image forming apparatus as claimed in claim 7, wherein
   the image information comprises color image information for plural colors.

10. The image forming apparatus as claimed in claim 8, wherein
    the image information comprises color image information for plural colors.

\* \* \* \* \*